US012628639B2

(12) United States Patent
Wang

(10) Patent No.: US 12,628,639 B2
(45) Date of Patent: May 12, 2026

(54) POWER GATING SWITCH TREE STRUCTURE FOR REDUCED WAKE-UP TIME AND POWER LEAKAGE

(71) Applicant: QUALCOMM Incorporated, San Diego, CA (US)

(72) Inventor: Yuehui Wang, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/306,003

(22) Filed: Apr. 24, 2023

(65) Prior Publication Data

US 2023/0268273 A1     Aug. 24, 2023

Related U.S. Application Data

(62) Division of application No. 17/331,450, filed on May 26, 2021, now Pat. No. 11,676,897.

(51) Int. Cl.
H01L 23/528 (2006.01)
H03K 19/00 (2006.01)
(Continued)

(52) U.S. Cl.
CPC ..... H01L 23/5286 (2013.01); H03K 19/0013 (2013.01); H10D 84/903 (2025.01); H10D 89/10 (2025.01)

(58) Field of Classification Search
CPC ........... H01L 23/5286; H01L 27/11803; H01L 27/0207; H03K 19/0013
(Continued)

(56) References Cited

U.S. PATENT DOCUMENTS

| 6,980,018 | B2 | 12/2005 | Ngo et al. |
| 7,142,019 | B2 | 11/2006 | Mair et al. |
| | | (Continued) | |

FOREIGN PATENT DOCUMENTS

| CN | 103684395 A | 3/2014 |
| EP | 2429079 A2 | 3/2012 |
| | (Continued) | |

OTHER PUBLICATIONS

European Search Report—EP20217697—Search Authority—Munich—Jun. 11, 2021.

(Continued)

*Primary Examiner* — Sheng-Bai Zhu
(74) *Attorney, Agent, or Firm* — Loza & Loza, LLP

(57) ABSTRACT

An aspect relates to an apparatus including a first and second power rails; a first set of power switch cells coupled to the first and second power rails, the first set of power switch cells being cascaded from an output to an input of a control circuit; and a second set of power switch cells coupled to the first and second power rails, the second set of power switch cells being coupled to one of a pair of cells of the first set, the first output, and the first input of the control circuit. Another aspect relates to a method including propagating a control signal via a first set of cascaded power switch cells to sequentially couple a first power rail to a second power rail; and propagating the control signal via a second set of power switch cells coupled between a pair of cells of the first set.

20 Claims, 8 Drawing Sheets

(51) Int. Cl.
    *H10D 84/90*          (2025.01)
    *H10D 89/10*          (2025.01)
(58) Field of Classification Search
    USPC ........................................................ 257/758
    See application file for complete search history.

(56)                References Cited

U.S. PATENT DOCUMENTS

|  |  |  |  |  |
|---|---|---|---|---|
| 7,659,746 | B2 | 2/2010 | Chua-Eoan et al. | |
| 7,760,011 | B2 | 7/2010 | Wang et al. | |
| 7,782,701 | B2 | 8/2010 | Seo et al. | |
| 7,791,406 | B1 * | 9/2010 | Wang ................. | H03K 19/0016 |
|  |  |  |  | 327/544 |
| 7,793,130 | B2 | 9/2010 | Yang et al. | |
| 7,863,778 | B2 | 1/2011 | Flynn et al. | |
| 8,015,419 | B2 | 9/2011 | Rowhani et al. | |
| 8,519,775 | B2 | 8/2013 | Idgunji et al. | |
| 8,542,054 | B2 | 9/2013 | Takayanagi et al. | |
| 8,823,209 | B2 | 9/2014 | Tatsumi et al. | |
| 8,853,815 | B1 | 10/2014 | Ranganathan et al. | |
| 9,705,491 | B1 | 7/2017 | Durnan et al. | |
| 10,693,457 | B2 | 6/2020 | Okamoto et al. | |
| 2002/0008999 | A1 * | 1/2002 | Hidaka .............. | H03K 19/0016 |
|  |  |  |  | 365/200 |
| 2008/0059824 | A1 | 3/2008 | Rowhani et al. | |
| 2008/0143423 | A1 * | 6/2008 | Komatsu ............ | H03K 19/0027 |
|  |  |  |  | 257/E21.632 |
| 2008/0174359 | A1 * | 7/2008 | Osada ................ | H03K 19/0008 |
|  |  |  |  | 327/534 |
| 2008/0270813 | A1 | 10/2008 | Yang et al. | |
| 2010/0164598 | A1 * | 7/2010 | Katou ................ | H03K 19/0016 |
|  |  |  |  | 327/415 |
| 2010/0231255 | A1 | 9/2010 | Kim et al. | |
| 2012/0066530 | A1 | 3/2012 | Suzuki et al. | |
| 2013/0057338 | A1 | 3/2013 | Venkatraman et al. | |
| 2013/0083437 | A1 | 4/2013 | Huang | |
| 2013/0106494 | A1 | 5/2013 | Takayanagi et al. | |
| 2013/0120045 | A1 | 5/2013 | Hegde | |
| 2014/0015590 | A1 | 1/2014 | Yoon et al. | |
| 2015/0355662 | A1 | 12/2015 | Myers et al. | |
| 2018/0315743 | A1 * | 11/2018 | Takeno .............. | H01L 29/1095 |
| 2022/0384343 | A1 | 12/2022 | Wang | |

FOREIGN PATENT DOCUMENTS

|  |  |  |  |
|---|---|---|---|
| GB | 2448962 A | | 11/2008 |
| JP | 2010153535 A | | 7/2010 |
| JP | 2015207326 | * | 11/2015 |
| KR | 20140007651 A | | 1/2014 |
| KR | 20140021252 | * | 2/2014 |
| WO | 2006088762 A2 | | 8/2006 |
| WO | 2013099098 A1 | | 7/2013 |
| WO | 2014150254 | | 9/2014 |
| WO | 2016168695 A1 | | 10/2016 |

OTHER PUBLICATIONS

International Search Report and Written Opinion—PCT/US2017/029186—ISA/EPO—Oct. 24, 2017.
International Search Report and Written Opinion—PCT/US2022/028342—ISA/EPO—Aug. 10, 2022.
Lidi Z., et al., "The Key Techniques Analysis and Circuits Design in Power Gating", Dissertation for the Master's Degree in Engineering, Jun. 2008, 69 Pages, Dec. 15, 2011.
Partial International Search Report—PCT/US2017/029186—ISA/EPO—Jul. 18, 2017.
Shyu Y-T., "An Efficient and Effective Methodology to Control Turn-On Sequence of Power Switches for Power Gating Designs", IEEE Transactions on Computer-Aided Design of Integrated Circuits and Systems, vol. 35, No. 10, Oct. 2016, pp. 1730-1743, Feb. 8, 2016.
Tzou Y-Y., et al., "FPGA Realization of Space-Vector PWM Control IC for Three-Phase PWM Inverters", IEEE Transactions on Power Electronics, Nov. 1997, vol. 12, No. 6, Dec. 31, 1997, pp. 953-963.
Taiwan Search Report—TW111117356—TIPO—Oct. 7, 2025.

* cited by examiner

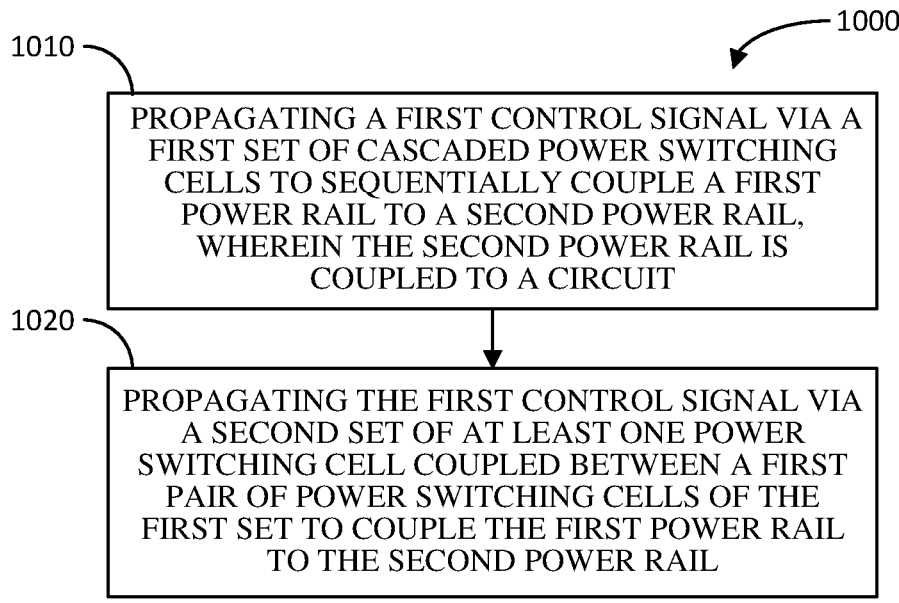

1010

1000

PROPAGATING A FIRST CONTROL SIGNAL VIA A
FIRST SET OF CASCADED POWER SWITCHING
CELLS TO SEQUENTIALLY COUPLE A FIRST
POWER RAIL TO A SECOND POWER RAIL,
WHEREIN THE SECOND POWER RAIL IS
COUPLED TO A CIRCUIT

1020

PROPAGATING THE FIRST CONTROL SIGNAL VIA
A SECOND SET OF AT LEAST ONE POWER
SWITCHING CELL COUPLED BETWEEN A FIRST
PAIR OF POWER SWITCHING CELLS OF THE
FIRST SET TO COUPLE THE FIRST POWER RAIL
TO THE SECOND POWER RAIL

FIG. 10

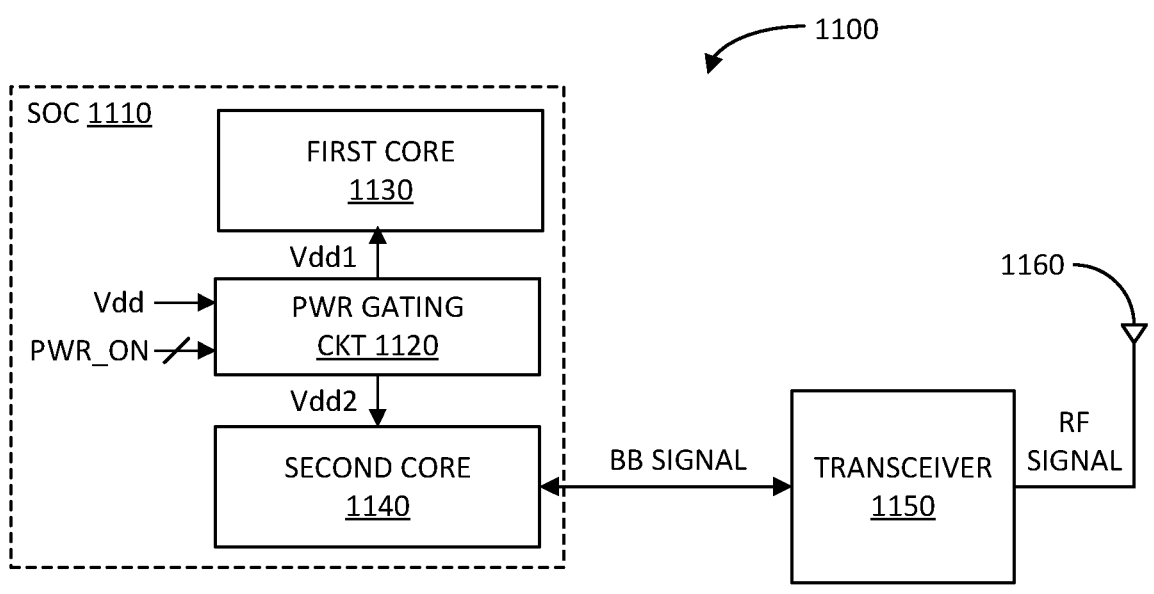

1100

SOC 1110

FIRST CORE
1130

Vdd1

Vdd →

PWR GATING
CKT 1120

PWR_ON →/→

Vdd2

SECOND CORE
1140

BB SIGNAL

TRANSCEIVER
1150

1160

RF
SIGNAL

FIG. 11

POWER GATING SWITCH TREE STRUCTURE FOR REDUCED WAKE-UP TIME AND POWER LEAKAGE

CROSS-REFERENCE TO RELATED APPLICATIONS

The present Application for Patent is a Divisional of pending U.S. Non-Provisional application Ser. No. 17/331, 450, filed May 26, 2021, and assigned to the assignee hereof and hereby expressly incorporated by reference herein as if fully set forth below and for all applicable purposes.

FIELD

Aspects of the present disclosure relate generally to power gating circuits, and in particular, to a power gating switch tree structure for reduced wake-up time and power leakage.

BACKGROUND

An integrated circuit (IC) typically includes multiple cores, such as a central processing unit (CPU) core, graphics processing unit (GPU) core, modem core, imaging (camera) core, memory core, etc. A power management integrated circuit (PMIC) may supply power (e.g., supply voltage and current) to the IC; and more, specifically, to a global power rail of the IC for further distribution therein. The IC may also include a power gating circuit for selectively coupling the global power rail to local power rails coupled to the various cores, respectively. The power gating circuit should be configured to selectively couple the global power rail to a local power rail without significantly affecting IC cores already coupled to the global power rail.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a first power rail; a second power rail; a control circuit including a first input and a first output; a first set of power switch cells coupled to the first and second power rails, wherein the first set of power switch cells are cascaded from the first output to the first input of the control circuit; and a second set of at least one power switch cell coupled to the first and second power rails, wherein the second set of at least one power switch cell is coupled to one of a first node between a first pair of power switch cells of the first set, the first output of the control circuit, and the first input of the control circuit.

Another aspect of the disclosure relates to a method. The method includes propagating a first control signal via a first set of cascaded power switch cells to sequentially couple a first power rail to a second power rail, wherein the second power rail is coupled to a circuit; and propagating the first control signal via a second set of at least one power switch cell coupled between a first pair of power switch cells of the first set to couple the first power rail to the second power rail.

Another aspect of the disclosure relates to an apparatus. The apparatus includes means for propagating a first control signal via a first set of cascaded power switch cells to sequentially couple a first power rail to a second power rail, wherein the second power rail is coupled to a circuit; and means for propagating the first control signal via a second set of at least one power switch cell coupled between a first pair of power switch cells of the first set to couple the first power rail to the second power rail.

Another aspect relates to a wireless communication device. The wireless communication device includes at least one antenna; a transceiver coupled to the at least one antenna; a signal processing core coupled to the transceiver; a first power rail; a second power rail coupled to the signal processing core; a control circuit including a first input and a first output; a first set of cascaded power switch cells coupled to the first and second power rails, wherein the first set of power switch cells are cascaded from the first output to the first input of the control circuit; and a second set of at least one power switch cell coupled to the first and second power rails, wherein the second set of at least one power switch cell is coupled to one of a first node between a first pair of power switch cells of the first set, the first output of the control circuit, and the first input of the control circuit.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF THE DRAWINGS

FIG. 10 illustrates a flow diagram of an example method of supplying power to a circuit in accordance with another aspect of the disclosure.

FIG. 11 illustrates a block diagram of an example wireless communication device in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
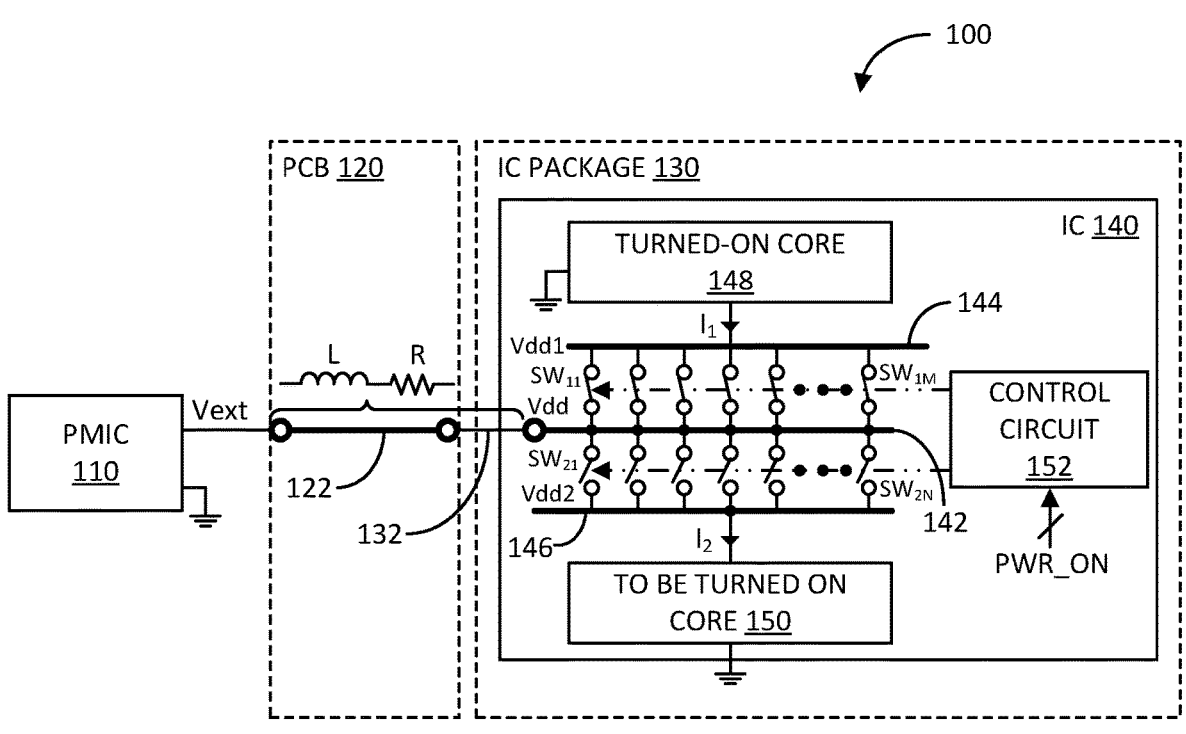
FIG. 1A illustrates a block diagram of an example integrated circuit (IC) power system in accordance with an aspect of the disclosure.

FIG. 1A illustrates a block diagram of an example integrated circuit (IC) power system 100 in accordance with an aspect of the disclosure. The IC power system 100 includes a power management integrated circuit (PMIC) 110, a printed circuit board (PCB) 120, and an integrated circuit (IC) package 130 enclosing an integrated circuit (IC) 140.

The PMIC 110 may be configured to generate an external supply voltage Vext. The PCB 120 includes a metallization trace 122 configured to route the external supply voltage Vext from the PMIC 110 to the IC package 130. The IC package 130 may include internal electrical routing (e.g., pins, pads, wirebonds, etc.) to further route the supply voltage Vext to a global power rail 142 of the IC 140. The metallization trace 122 of the PCB 120 and internal routing 132 of the IC package 130 may be modeled as an inductor L coupled in series with a resistor R, as illustrated in FIG. 1A. As such, there are going to be current-resistive (IR) loses via the PCB metallization trace 122 and package internal routing 132 such that the supply voltage Vdd at the global power rail 142 is less than the external supply voltage Vext (e.g., Vdd<Vext).

The IC 140 includes a first local power rail 144 coupled to a first IC core 148 (e.g., a central processing unit (CPU) core, which may also be referred to herein as a "turned-on core"). The IC 140 further includes a second local power rail 146 coupled to a second IC core 150 (e.g., an imaging or camera core, which may also be referred to herein as a "to be turned on core"). The IC 140 may further include a power gating circuit, which may collectively include a control circuit 152, a first set of power switch cells SW$_{11}$ to SW$_{1M}$, and a second set of power switch cells SW$_{21}$ to SW$_{2N}$ (where M and N are integers). The first set of power switch cells SW$_{11}$ to SW$_{1M}$ selectively couple the global power rail 142 to the first local power rail 144 in response to a first control signal generated by the control circuit 152. Similarly, the second set of power switch cells SW$_{21}$ to SW$_{2N}$ selectively couple the global power rail 142 to the second local power rail 146 in response to a second control signal generated by the control circuit 152.

Thus, when the first core 148 is to be turned on as specified by a power on signal (PWR_ON) provided to the control circuit 152, the control circuit 152 generates the first control signal to close the first set of power switch cells SW$_{11}$ to SW$_{1M}$ to couple the global power rail 142 to the first local power rail 144 to provide a supply voltage Vdd1 to the first core 148. As there may be some IR loses in the first set of power switch cells SW$_{11}$ to SW$_{1M}$, the supply voltage Vdd1 at the first local power rail 144 may be slightly less than the supply voltage Vdd at the global power rail 142.

Similarly, when the second core 150 is to be turned on as specified by the PWR_ON signal, the control circuit 152 generates the second control signal to close the second set of power switch cells SW$_{21}$ to SW$_{2N}$ to couple the global power rail 142 to the second local power rail 146 to provide a supply voltage Vdd2 to the second core 150. As there may be some IR loses in the second set of power switch cells SW$_{21}$ to SW$_{2N}$, the supply voltage Vdd2 at the second local power rail 146 may be slightly less than the supply voltage Vdd at the global power rail 142.

In some situations, the first core 148 may already be turned on, such as the case where a CPU core would be one of the first cores to be turned on in the IC 140. Then, at some subsequent time, the second core 150 may be turned on, such as the case where an imaging or camera core may be used to capture an image or video. Prior to turning on the second core 150, the first set of power switch cells SW$_{11}$ to SW$_{1M}$ may be in their closed states, and the second set of power switch cells SW$_{21}$ to SW$_{2N}$ may be in their open states. When the second core 150 is to be turned on, the control circuit 152 generates the second control signal to close the second set of power switch cells SW$_{21}$ to SW$_{2N}$. If, for example, the first core 148 has a capacitive load significantly lower than the capacitive load of the second core 150, and the second set of power switch cells SW$_{21}$ to SW$_{2N}$ are closed abruptly, the second core 150 would draw current I$_1$ from the first core 148, and disturb the supply voltage Vdd1 at the first local power rail 144. This may cause incorrect operation of the first core 148, which may lead to bit errors and/or circuit failure.

Figure 1B:
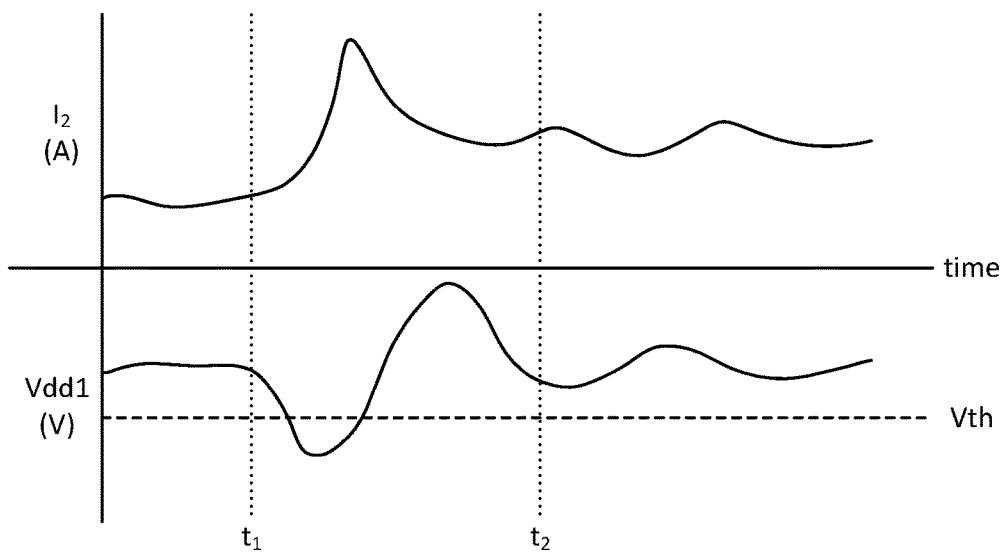
FIG. 1B illustrates a graph depicting current and voltage time responses associated with the IC power system of FIG. 1B in accordance with another aspect of the disclosure.

FIG. 1B illustrates a graph depicting current and voltage time responses associated with the IC power system 100 in accordance with another aspect of the disclosure. The x- or horizontal axis of the graph represents time. The upper portion of the y- or vertical axis represents the current I$_2$ drawn by the second core 150. The lower portion of the y- or vertical axis represents the supply voltage Vdd1 at the first local power rail 144. As the graph illustrates, at time t$_1$, the control circuit 152 turns on (closes) the second set of power switch cells SW$_{21}$ to SW$_{2N}$, which causes the current I$_2$ drawn by the second core 150 to rise quickly. As discussed, this has the consequence of the second core 150 drawing current I$_1$ from the first power rail 144 via the global power rail 142. As a result, the supply voltage Vdd1 decreases, as the graph illustrates. The current I$_2$ and voltage Vdd1 responses may be underdamped, and may include overshoots, undershoots, and oscillations towards a steady-state level.

At a later time t$_2$, the current I$_2$ drawn by the second core 150 reaches substantially a steady-state current, and the supply voltage Vdd1 at the first power rail 144 recovers substantially to the voltage level prior to the second core 150 being turned on. As the graph illustrates, between times t$_1$ and t$_2$ (also known as the "wake-up" time), the supply voltage Vdd1 may have decreased to a minimum voltage, which may be below a safe minimum voltage threshold Vth (e.g., 10 percent below a specified level for Vdd1). In such case, the supply voltage Vdd1, being below the safe voltage threshold Vth, may cause operational problems for the first core 148, which may produce bit errors or circuit failure. Thus, the manner in which the second set of power switch cells $SW_{21}$ to $SW_{2N}$ may be turned on could reduce the droop in the supply voltage Vdd1, and maintain the supply voltage Vdd1 above the safe threshold Vth when the second core 150 is turned on.

Figure 2A:
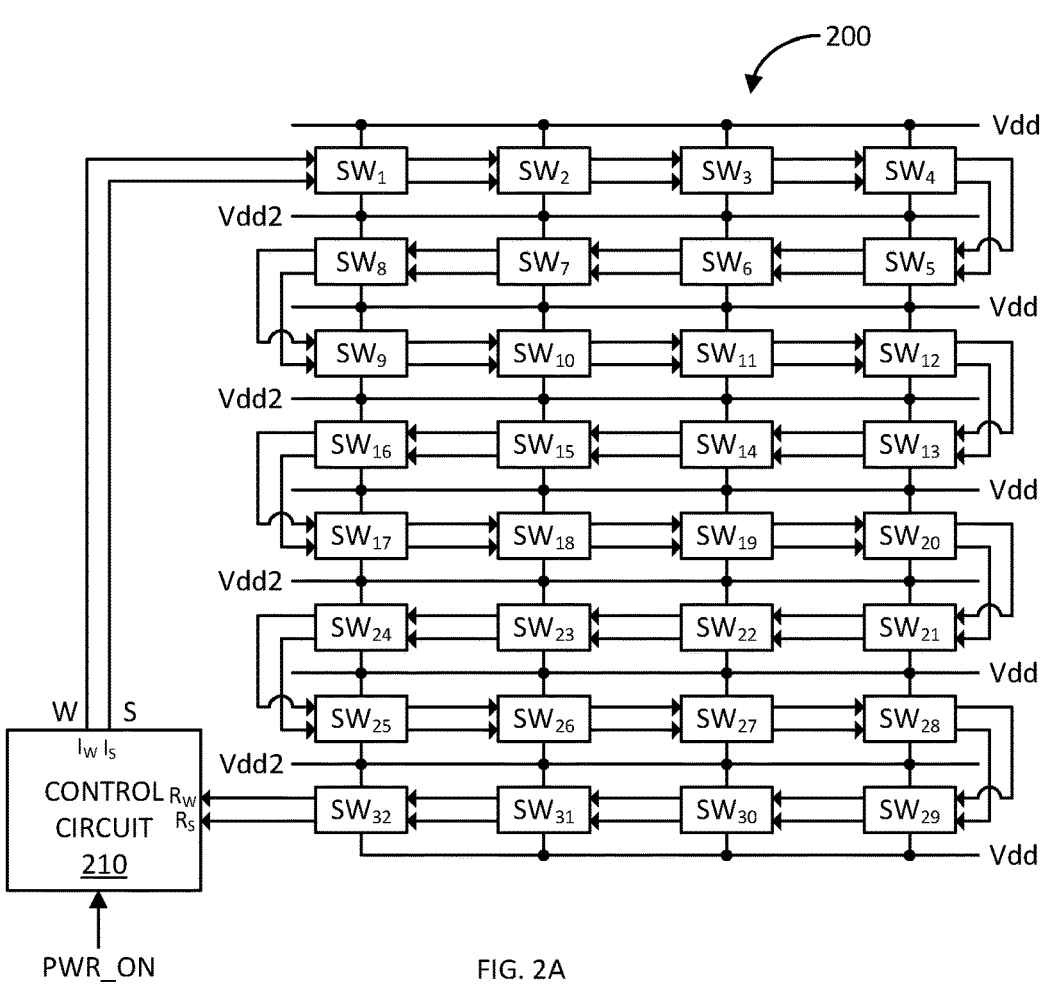
FIG. 2A illustrates a block diagram of an example power gating circuit in accordance with another aspect of the disclosure.

FIG. 2A illustrates a block diagram of an example power gating circuit 200 in accordance with another aspect of the disclosure. The power gating circuit 200 is configured to gradually couple a global power rail Vdd to a local power rail Vdd2 such that the supply voltage at another local power rail Vdd2, already coupled to the global power rail Vdd, is not disturbed in a manner that it decreases below the safe voltage threshold Vth. For ease of illustration and explanation, the global supply voltage and global power rail are referred to as Vdd, and the local supply voltage and local power rail are referred to as Vdd2.

More specifically, the power gating circuit 200 includes a set of power switch cells $SW_1$ to $SW_{32}$ (e.g., 32 in this example, but could have a different number of cells). The set of power switch cells $SW_1$ to $SW_{32}$ are coupled between the global power rail Vdd and the local power rail Vdd2. From a control signal propagation perspective, the set of power switch cells $SW_1$ to $SW_{32}$ are cascaded from a pair of outputs $I_W$ and $I_S$ of a control circuit 210 to a pair of inputs $R_W$ and $R_S$ of the control circuit 210.

Cascaded means the power switch cells $SW_1$ to $SW_{31}$ (except for the last one $SW_{32}$, which includes output(s) coupled to the control circuit 210) include outputs coupled to inputs of the following power switch cells $SW_2$ to $SW_{32}$, respectively, similar to a daisy chain. Or said another way, cascaded means the power switch cells $SW_2$ to $SW_{32}$ (except for the first one $SW_1$, which includes input(s) coupled to the control circuit 210) include inputs coupled to outputs of the preceding power switch cells $SW_1$ to $SW_{31}$, respectively, again similar to a daisy chain.

As discussed in more detail herein, each of the power switch cells $SW_1$ to $SW_{32}$ include two independent inputs and two independent outputs. Via the first input/output, each power switch cell propagates a weak (W) control signal along the set of cascaded power switch cells $SW_1$ to $SW_{32}$, while closing or turning on a relatively small switching device (e.g., a field effect transistor (FET)), which couples the global power rail Vdd to the local power rail Vdd2. Via the second input/output, each power switch cell propagates a strong (S) control signal along the set of cascaded power switch cells $SW_1$ to $SW_{32}$, while closing or turning on a relatively large switching device (e.g., FET), which couples the global power rail Vdd to the local power rail Vdd2. As an example, the relatively large switching FET device may have a channel width to length (W/L) ratio 1000 times greater than the relatively small switching FET device.

In operation, in response to a power on (PWR_ON) signal, the control circuit 210 may generate (assert) the weak (W) control signal at the $I_W$ output. The weak (W) control signal then propagates to the first power switch cell $SW_1$, causing its relatively small switching device to turn on and couple the global power rail Vdd to the local power rail Vdd2. The weak (W) control signal then propagates to the second power switch cell $SW_2$, causing its relatively small switching device to turn on and further couple the global power rail Vdd to the local power rail Vdd2. The weak (W) control signal then propagates to the third power switch cell $SW_3$, causing its relatively small switching device to turn on and further couple the global power rail Vdd to the local power rail Vdd2. In a similar manner, the propagation of the weak (W) control signal continues through power switch cells $SW_4$ to $SW_{32}$ sequentially further coupling the global power rail Vdd to the local power rail Vdd2 until the weak (W) control signal reaches a first input $R_W$ of the control circuit 210.

In response to receiving the weak (W) control signal at the first input $R_W$, the control circuit 210 may generate (assert) the strong (S) control signal at the $I_S$ output. The strong (S) control signal then propagates to the first power switch cell $SW_1$, causing its relatively large switching device to turn on and further couple the global power rail Vdd to the local power rail Vdd2. The strong (S) control signal then propagates to the second power switch cell $SW_2$, causing its relatively large switching device to turn on and further couple the global power rail Vdd to the local power rail Vdd2. The strong (S) control signal then propagates to the third power switch cell $SW_3$, causing its relatively large switching device to turn on and further couple the global power rail Vdd to the local power rail Vdd2. In a similar manner, the propagation of the strong (S) control signal continues through power switch cells $SW_4$ to $SW_{32}$ sequentially further coupling the global power rail Vdd to the local power rail Vdd2 until the strong (S) control signal reaches a second input $R_S$ of the control circuit 210.

Figure 2B:
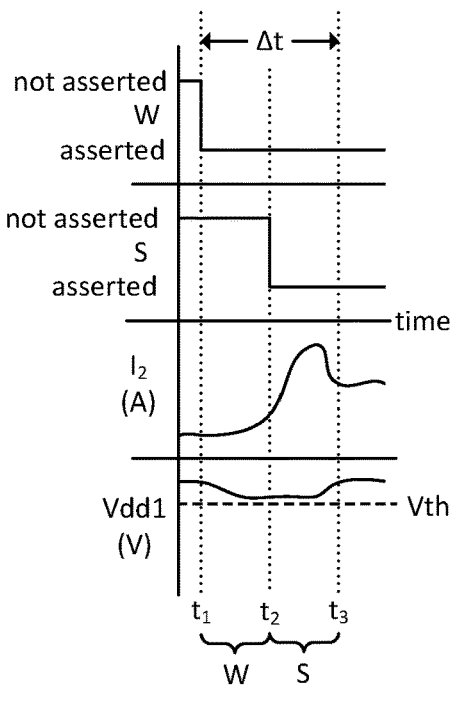
FIG. 2B illustrates a graph depicting control signals, current and voltage responses versus time associated with the power gating circuit of FIG. 2A in accordance with another aspect of the disclosure.

FIG. 2B illustrates a graph depicting the weak (W) and strong (S) control signals, current $I_2$ and voltage Vdd1 responses versus time associated with the power gating circuit 200 in accordance with another aspect of the disclosure. The x- or horizontal axis of the graph represents time. The top portion of the y- or vertical axis represents the weak (W) control signal. The second from the top portion represents the strong (S) control signal. The third from the top portion represents the current $I_2$ drawn by a core coupled to the local power rail Vdd2. The bottom portion represents the supply voltage Vdd1 at a local power rail already coupled to the global power rail Vdd.

As the graph illustrates, prior to time $t_1$, both the weak (W) and strong (S) control signals are not asserted (which, in this example, is a logic high voltage). As a result, the set of power switch cells $SW_1$ to $SW_{32}$ are in their open states; thus, the global power rail Vdd is not coupled to the local power rail Vdd2. Accordingly, as there is no supply voltage on the local power rail Vdd2, the current $I_2$ drawn by the core coupled to the local power rail Vdd2 is substantially nil (e.g., there may be some leakage current through the switching devices of the power switch cells $SW_1$ to $SW_{32}$). Also, prior to time $t_1$, the supply voltage Vdd1 at the other local voltage rail is within specification, e.g., above the safe threshold voltage Vth by a specified margin.

At time $t_1$, the PWR_ON signal is set to turn on the core coupled to the local power rail Vdd2. In response to the PWR_ON signal, the control circuit 210 asserts the weak (W) control signal (e.g., setting it to a logic low voltage). As discussed, the weak (W) control signal propagates through the set of power switch cells $SW_1$ to $SW_{32}$ sequentially and progressively coupling the global power rail Vdd to the local power rail Vdd2. At time $t_2$, the weak (W) control signal arrives at the $R_W$ input of the control circuit 210; thereby, ending the weak (W) power rail coupling phase. As illustrated, during the weak (W) coupling phase, the current $I_2$ drawn by the core coupled to the local power rail Vdd2 gradually increases to minimize or reduce the impact on the supply voltage Vdd1 at the other local power rail. As a result, the supply voltage Vdd1 decreases slightly, but not below the safe threshold voltage Vth.

At time $t_2$, in response to receiving the weak (W) control signal at the $R_W$ input, the control circuit 210 asserts the strong (S) control signal (e.g., setting it to a logic low voltage). As discussed, the strong (S) control signal propagates through the set of power switch cells $SW_1$ to $SW_{32}$ sequentially and progressively coupling the global power rail Vdd to the local power rail Vdd2. At time $t_3$, the strong (S) control signal arrives at the $R_S$ input of the control circuit 210; thereby, ending the strong (S) power rail coupling phase. As illustrated, during the strong (S) coupling phase, the slope of the current $I_2$ drawn by the core coupled to the local power rail Vdd2 increases significantly, and may include an overshoot and oscillation towards a steady-state current. As a consequence of the strong (S) coupling, a speeding up of the full coupling of the global power rail Vdd to the local power rail Vdd2 occurs. As the core coupled to the local power rail Vdd2 is already drawing current $I_2$ due to the weak (W) coupling phrase, the rate in which current $I_2$ is drawn after time $t_2$ does not significantly impact the supply voltage Vdd1. As a result, the supply voltage Vdd1 stays above the safe threshold voltage Vth.

Figures 3, 4:
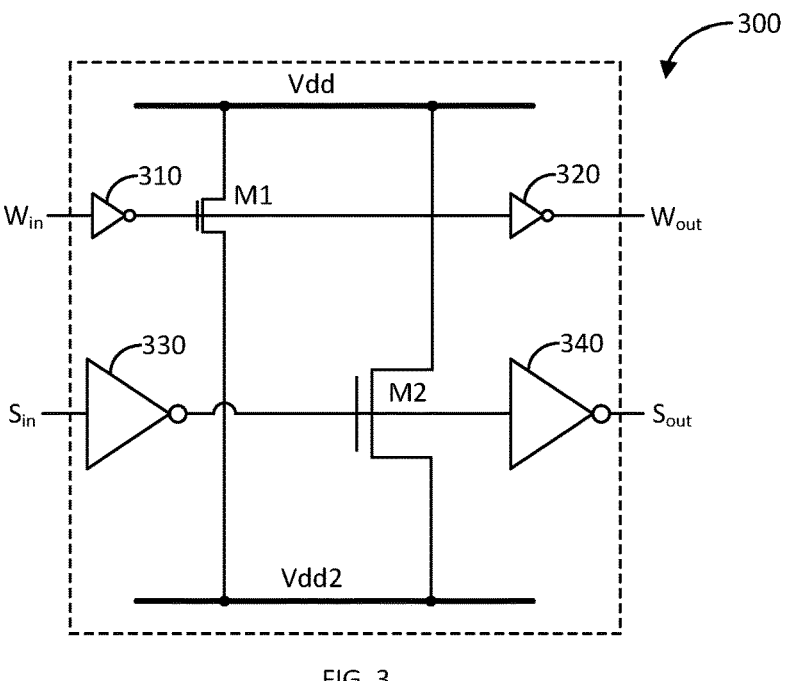
FIG. 3 illustrates a schematic diagram of an example power switch cell in accordance with another aspect of the disclosure.
FIG. 4 illustrates a block diagram of another example power gating circuit in accordance with another aspect of the disclosure.

FIG. 3 illustrates a schematic diagram of an example power switch cell 300 in accordance with another aspect of the disclosure. The power switch cell 300 may be an example implementation of each of the power switch cells $SW_1$ to $SW_{32}$ of power gating circuit 200.

With regard to the weak (W) control signal propagation path, the power switch cell 300 includes a first input buffer or inverter 310, a first FET M1 (which could be implemented as an n-channel metal oxide semiconductor (NMOS) FET or a p-channel metal oxide semiconductor (PMOS) FET), and a first output buffer or inverter 320. The first input buffer or inverter 310 includes an input serving as the weak (W) control signal input $W_{in}$ of the power switch cell 300. The first FET M1 is coupled between the global power rail Vdd (via drain/source terminal) and the local power rail Vdd2 (via source/drain terminal), and includes a gate coupled to an output of the first input buffer or inverter 310. The first output buffer or inverter 320 includes an input coupled to the gate of the first FET M1, and an output serving as the weak (W) control signal output $W_{out}$ of the power switch cell 300.

With regard to the strong (S) control signal propagation path, the power switch cell 300 includes a second input buffer or inverter 330, a second FET M2 (which could be implemented as an NMOS FET or PMOS FET), and a second output buffer or inverter 340. The second input buffer or inverter 330 includes an input serving as the strong (S) control signal input $S_{in}$ of the power switch cell 300. The second FET M2 is coupled between the global power rail Vdd (via drain/source terminal) and the local power rail Vdd2 (via source/drain terminal), and includes a gate coupled to an output of the second input buffer or inverter 330. The second output buffer or inverter 340 includes an input coupled to the gate of the second FET M2, and an output serving as the strong (S) control signal output Sour of the power switch cell 300. As discussed, the second FET M2 may be larger than the first FET M1.

In operation, when the asserted weak (W) control signal (e.g., at a logic low voltage) propagates to the weak input $W_{in}$ of the power switch cell 300, the first input inverter 310 inverts the weak (W) control signal to generate a logic high voltage. The logic high voltage is applied to the gate of the first NMOS FET M1; thereby, turning of the first FET M1, and coupling the global power rail Vdd to the local power rail Vdd2. The first output inverter 320 inverts the logic high voltage at the gate of the first NMOS FET M1 to output the asserted logic low weak (W) control signal for the following power switch cell or the input $R_W$ of the control circuit 210.

Similarly, when the asserted strong (S) control signal (e.g., at a logic low voltage) propagates to the strong input $S_{in}$ of the power switch cell 300, the second input inverter 330 inverts the strong (S) control signal to generate a logic high voltage. The logic high voltage is applied to the gate of the second NMOS FET M2; thereby, turning of the second NMOS FET M2, and coupling the global power rail Vdd to the local power rail Vdd2. The second output inverter 340 inverts the logic high voltage at the gate of the second NMOS FET M2 to output the asserted logic low strong (S) control signal for the following power switch cell or the input $R_S$ of the control circuit 210.

Although the power gating circuit 200 provides an effective method of turning on the core coupled to the local power rail Vdd2 without significantly affecting the supply voltage Vdd1 at another local power rail (e.g., maintaining Vdd1 above the safe threshold voltage Vth), the power gating circuit 200 may consume significant amount of time to fully couple the global power rail Vdd to the local power rail Vdd2 due to the cascaded arrangement of the set of power switch cells (e.g., the wake-up time may be relatively large). Further, because each power switch cell includes two (2) input buffers or inverters and two (2) output buffers or inverters, there may be significant current leakage associated with the set of power switch cells; thereby, reducing the power efficiency of the power gating circuit 200. The buffers or inverters may also occupy significant IC footprint.

FIG. 4 illustrates a block diagram of another example power gating circuit 400 in accordance with another aspect of the disclosure. The power gating circuit 400 may be configured to provide a faster wake-up time to fully couple a global power rail Vdd to a local power rail Vdd2 compared to that of power gating circuit 200, while maintaining the supply voltage Vdd1 at another local power rail coupled to the global power rail Vdd above the safe threshold voltage Vth. Additionally, the power gating circuit 400 may also be configured to have less current leakage compared to that of power gating circuit 200 to reduce power consumption or operate the power gating circuit 400 in a more power efficient manner. Furthermore, the power gating circuit 400 may occupy significantly less IC footprint as compared to power gating circuit 200. As discussed further herein the power gating circuit 400 may have a "binary" power switch tree structure.

In particular, the power gating circuit 400 includes a first set of power switch cells $SW_{11}$ to $SW_{14}$ to $SW_{24}$ to $SW_{84}$ cascaded from $I_W$ and $I_S$ outputs of a control circuit 410 to $R_W$ and $R_S$ inputs of the control circuit 410, respectively. The power gating circuit 400 further includes sets of cascaded power switch cells $SW_{21}$ to $SW_{81}$, $SW_{22}$ to $SW_{82}$, and $SW_{23}$ to $SW_{83}$ coupled to or extending from nodes between distinct pairs $SW_{11}/SW_{12}$, $SW_{12}/SW_{13}$, and $SW_{13}/SW_{14}$ of power switch cells of the first set, respectively. In this example, the sets of power switch cells $SW_{21}$ to $SW_{81}$, $SW_{22}$ to $SW_{82}$, and $SW_{23}$ to $SW_{83}$ do not terminate at the control circuit 410. As discussed in more detail herein, the sets of power switch cells $SW_{21}$ to $SW_{81}$, $SW_{22}$ to $SW_{82}$, and $SW_{23}$ to $SW_{83}$ include respective non-driving or end power switch cells $SW_{81}$ to $SW_{83}$, which are depicted with a dark shading as they may not include output buffers or inverters because they do not drive a following power switch cell.

Note that a first subset $SW_{11}$ to $SW_{14}$ of the first set of power switch cells extend substantially orthogonal to the direction towards which the sets of power switch cells $SW_{21}$ to $SW_{81}$, $SW_{22}$ to $SW_{82}$, and $SW_{23}$ to $SW_{83}$ extend. Also note that a second subset $SW_{24}$ to $SW_{84}$ of the first set of power switch cells extend substantially parallel with the direction towards which the sets of power switch cells $SW_{21}$ to $SW_{81}$, $SW_{22}$ to $SW_{82}$, and $SW_{23}$ to $SW_{83}$ extend.

The power gating circuit 400 further includes non-driving or end power switch cells $SW_{31}$ to $SW_{71}$ (indicated with the dark shading) coupled to distinct pairs $SW_{21}/SW_{41}$, $SW_{41}/SW_{61}$, and $SW_{61}/SW_{81}$ of the set of cascaded power switch cells $SW_{21}$ to $SW_{81}$, respectively. The power gating circuit 400 also includes non-driving or end power switch cells $SW_{32}$ to $SW_{72}$ (indicated with the dark shading) coupled to distinct pairs $SW_{22}/SW_{42}$, $SW_{42}/SW_{62}$, and $SW_{62}/SW_{82}$ of the set of cascaded power switch cells $SW_{22}$ to $SW_{82}$, respectively. Additionally, the power gating circuit 400 also includes non-driving or end power switch cells $SW_{33}$ to $SW_{73}$ (indicated with the dark shading) coupled to distinct pairs $SW_{23}/SW_{43}$, $SW_{43}/SW_{63}$, and $SW_{63}/SW_{83}$ of the set of cascaded power switch cells $SW_{23}$ to $SW_{83}$, respectively. And, in this example, the power gating circuit 400 also includes non-driving or end power switch cells $SW_{34}$ to $SW_{74}$ (indicated with the dark shading) coupled to distinct pairs $SW_{24}/SW_{44}$, $SW_{44}/SW_{64}$, and $SW_{64}/SW_{84}$ of the set of cascaded power switch cells $SW_{24}$ to $SW_{84}$, respectively. All of the power switch cells of the power gating circuit 400 are coupled between a global power rail Vdd and a local power rail Vdd2.

The power gating circuit 400 may provide a faster wake-up time than the power gating circuit 200 because in power gating circuit 400, multiple power switch cells are turned on at substantially the same time. Assuming each of the power switch cells have substantially the same signal delay (D), after propagating through power switch cell $SW_{11}$, the control signal (weak or strong) turns on power switch cells $SW_{12}$ and $SW_{21}$ substantially simultaneously; then turns on power switch cells $SW_{13}$, $SW_{22}$, $SW_{41}$, and $SW_{31}$ substantially simultaneously; then turns on power switch cells $SW_{14}$, $SW_{23}$, $SW_{42}$, $SW_{32}$, $SW_{61}$, and $SW_{51}$ substantially simultaneously; and so on. With this tree structure (which may be referred to as a "binary" tree structure because the number of cells simultaneously activated increases and decreases in a manner similar to how binary numbers increase and decrease by one (1)), the turn-on progression is as follows: 1 cell, 2 cells, 4 cells, 6 cells, 7 cells, 6 cells, 4 cells, and 2 cells with an 8-cell delay (D). Whereas the power gating circuit 200 requires a 32-cell delay (D) to complete the propagation of a single control signal. Thus, the wake-up time may be decreased significantly using the power gating circuit 400.

Figures 5, 6:
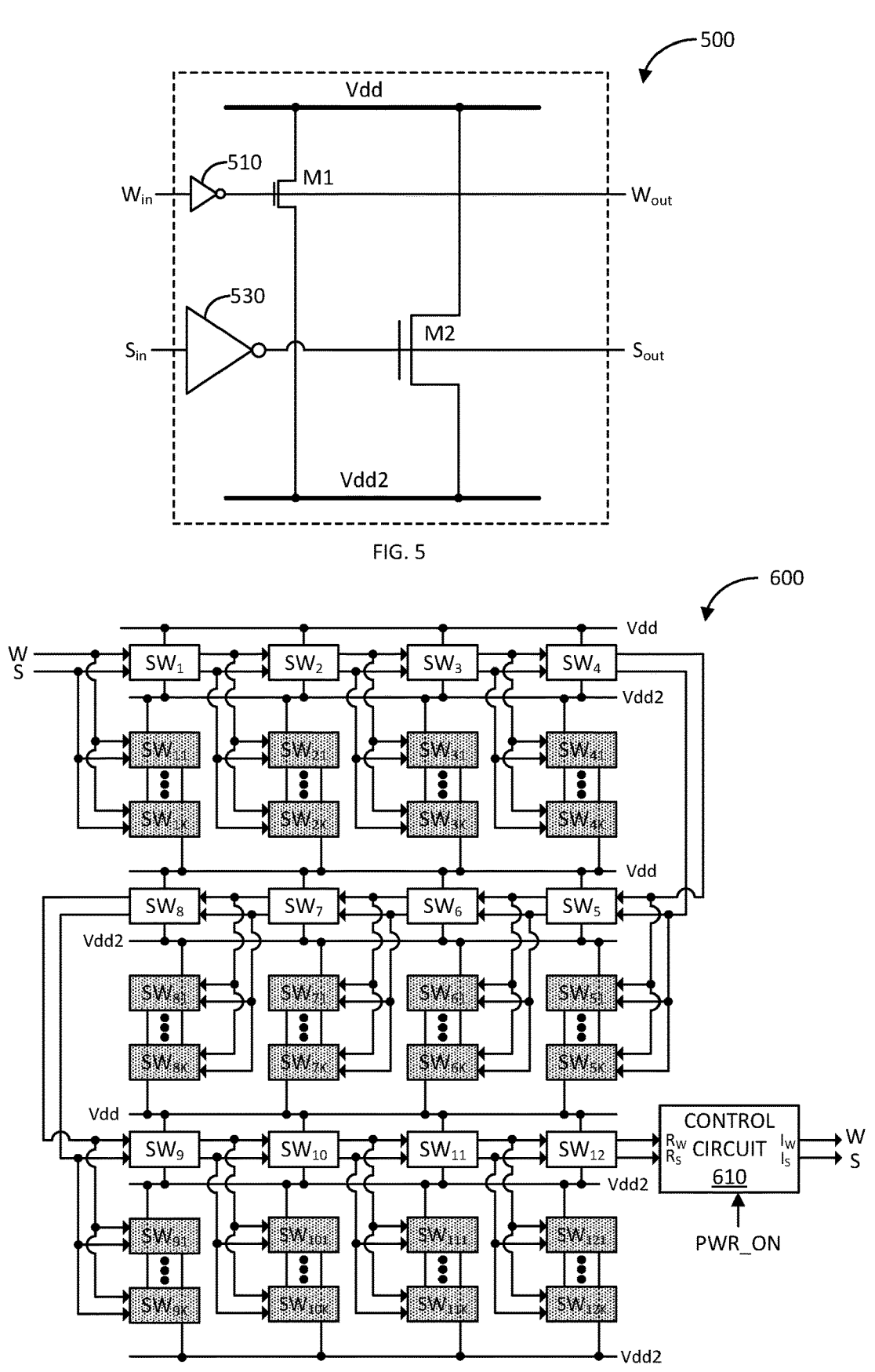
FIG. 5 illustrates a schematic diagram of another example power switch cell in accordance with another aspect of the disclosure.
FIG. 6 illustrates a block diagram of another example power gating circuit in accordance with another aspect of the disclosure.

FIG. 5 illustrates a schematic diagram of another example power switch cell 500 in accordance with another aspect of the disclosure. The power switch cell 500 may be an example implementation of any of the non-driving or end power switch cells $SW_{31}$ to $SW_{71}$, $SW_{81}$, $SW_{32}$ to $SW_{72}$, $SW_{82}$, $SW_{33}$ to $SW_{73}$, $SW_{83}$, $SW_{34}$ to $SW_{74}$, and $SW_{84}$ of power gating circuit 400.

With regard to the weak (W) control signal path, the power switch cell 500 includes a first input buffer or inverter 510 and a first FET M1 (which could be implemented as an NMOS FET or PMOS FET). The first input buffer or inverter 510 includes an input serving as the weak (W) control signal input $W_{in}$ of the power switch cell 500. The first FET M1 is coupled between the global power rail Vdd and the local power rail Vdd2, and includes a gate coupled to an output of the first input buffer or inverter 510. As the non-driving or end power switch cell 500 does not precede another power switch cell, it need not include an output buffer or inverter in the weak (W) control signal path. Thus, the power switch cell 500 may be described as having a floating weak (W) control signal output $W_{out}$.

With regard to the strong (S) control signal path, the power switch cell 500 includes a second input buffer or inverter 530 and a second FET M2 (which could be implemented as an NMOS FET or PMOS FET). The second input buffer or inverter 530 includes an input serving as the strong (S) control signal input $S_{in}$ of the power switch cell 500. The second FET M2 is coupled between the global power rail Vdd and the local power rail Vdd2, and includes a gate coupled to an output of the second input buffer or inverter 530. As discussed, the second FET M2 may be larger than the first FET M1. As the non-driving or end power switch cell 500 does not precede another power switch cell, it need not include an output buffer or inverter in the strong (S) control signal path. Thus, the power switch cell 500 may be described as also having a floating strong (S) control signal output $S_{out}$.

Output buffers or inverters in a power switch cell are potential sources of current leakage. Accordingly, the power switch cell 500 may have less current leakage than the power switch cell 300 that includes output buffers or inverters 320 and 340. Comparing the power gating circuit 400 to power gating circuit 200, all of the power switch cells $SW_1$ to $SW_{32}$ in power gating circuit 200 include output buffers or inverters, whereas, in power gating circuit 400, only 17 out of 32 power switch cells have output buffers or inverters. Thus, the power gating circuit 400 may be about 50 percent greater in power efficiency compared to power gating circuit 200. Furthermore, output buffers or inverters also occupy IC footprint. By having non-driving or end power switch cells, the power gating circuit 400 may also have a smaller IC footprint compared to that of power gating circuit 200.

FIG. 6 illustrates a block diagram of another example power gating circuit 600 in accordance with another aspect of the disclosure. The power gating circuit 600 may also be configured to provide a faster wake-up time to fully couple a global power rail Vdd to a local power rail Vdd2 compared to that of power gating circuit 200, while maintaining the supply voltage Vdd1 at another local power rail (coupled to the global power rail Vdd) above the safe threshold voltage Vth. Additionally, the power gating circuit 600 may also be configured to have less current leakage compared to that of power gating circuit 200 to reduce power consumption or operate the power gating circuit 600 in a more power efficient manner. Additionally, the power gating circuit 600 may be implemented using a smaller IC footprint compared to power gating circuit 200.

As discussed in more detail herein, the power gating circuit 600 includes a power switch cell tree structure, which may be referred to as a "dangling" tree structure, because it includes power switching cells coupled in parallel with each power switch cell of a cascaded set. That is, from a top view of the tree structure, the parallel power switching cells appear to be "dangling" off of the corresponding cascaded power switching cell.

In particular, the power gating circuit 600 includes a first set of power switch cells $SW_1$ to $SW_{12}$ cascaded from $I_W$ and $I_S$ outputs of a control circuit 610 to $R_W$ and $R_S$ inputs of the control circuit 610, respectively. The first set of power switch cells $SW_1$ to $SW_{12}$ are coupled between a global power rail Vdd and a local power rail Vdd2, as previously discussed.

The power gating circuit 600 may further include a set of power switch cells coupled in parallel with each of the power switch cells $SW_1$ to $SW_{12}$ of the first set. For example, a first set of power switch cells $SW_{11}$ to $SW_{1K}$ is coupled in parallel with power switch cell $SW_1$ of the first set. A second set of power switch cells $SW_{21}$ to $SW_{2K}$ is coupled in parallel with power switch cell $SW_2$ of the first set. A third set of power switch cells $SW_{31}$ to $SW_{3K}$ is coupled in parallel with power switch cell $SW_3$ of the first set; and so on, with sets of power switch cells $SW_{41}$-$SW_{4K}$ to $SW_{121}$-$SW_{12K}$ coupled in parallel with power switch cells $SW_4$ to $SW_{12}$ of the first set, respectively. The parallel power switching cells are also coupled between the global power rail Vdd and the local power rail Vdd2.

As each power switch cell of the sets of parallel power switch cells $SW_{11}$-$SW_{1K}$ to $SW_{121}$-$SW_{12K}$ do not precede or drive another power switch cell, each power switch cell may be implemented as a non-driving or end power switch cell, such as power switch cell 500. As the power switch cell 500 does not include output buffers or inverters as previously discussed, the power switch cell 500 is less prone to current leakage and may have a smaller IC footprint compared to power switch cell 300 that includes output buffers or inverters. As an example, if K is equal to two (2), the power gating circuit 600 includes 36 power switch cells, where only 12 out of 36 include output buffers or inverters, whereas the power gating circuit 200 has 32 power switch cells, each having output buffers or inverters. Thus, the power gating circuit 600 may be about 67 percent greater in power efficiency and 3 percent smaller in IC footprint compared to power gating circuit 200.

In terms of wake-up time, each of the sets of parallel power switch cells $SW_1$-$SW_{1K}$ to $SW_{12}$-$SW_{12K}$ are woken up at substantially the same time by a corresponding control signal (weak (W) or strong (S)). As there are 12 power switch cells SW1 to SW12 cascaded from $I_W$ and $I_S$ outputs to $R_W$ and $R_S$ inputs of the control circuit 610, the wake-up time for the power gating circuit 600 is 2*12*D or 24D, where D is the control signal delay of each power switch cell (assuming the delay D is substantially the same for all power switch cells). Compared to power gating circuit 200, it includes 32 power switch cells $SW_1$ to $SW_{32}$ cascaded from $I_W$ and $I_S$ outputs to $R_W$ and $R_S$ inputs of the control circuit 210. Thus, the wake-up time for power gating circuit 200 is 2*32*D or 64D, which is much greater than the wake-up time of 24D of power gating circuit 600.

Figure 7A:
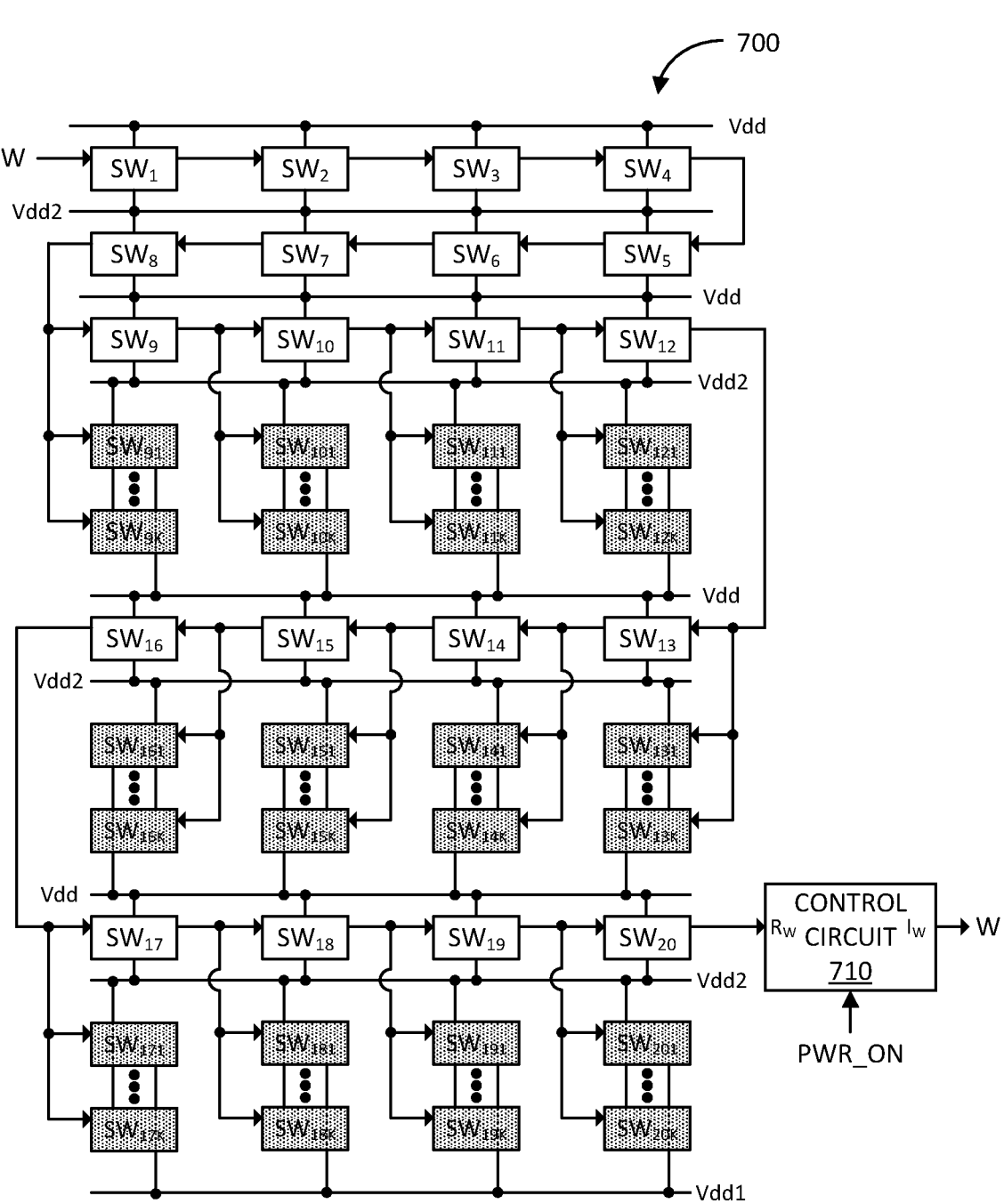
FIGS. 7A-7B collectively illustrate a block diagram of another example power gating circuit in accordance with another aspect of the disclosure.

FIG. 7A illustrates a block diagram of another example power gating circuit 700 (weak (W) signal routing) in accordance with another aspect of the disclosure. In the power gating circuits 200, 400, and 600 previously discussed, the routing or cell-to-cell interconnection between power switch cells are the same for both the weak (W) and strong (S) control signals, albeit in parallel. However, it shall be understood that the routing or cell-to-cell interconnection between the power switch cells may be different for the weak (W) and strong (S) signals. The power gating circuit 700 is an example of such an implementation. FIG. 7A illustrates the routing or interconnection of power switch cells for the weak (W) control signal; whereas FIG. 7B, discussed further herein, illustrates the routing or interconnection of power switch cells for the strong (S) control signal.

More specifically, the power gating circuit 700 includes a first set of power switch cells $SW_1$ to $SW_8$ cascaded from an $I_W$ output of a control circuit 710, similar to the cascaded implementation of power gating circuit 200. The power gating circuit 700 further includes a second set of power switch cells $SW_9$ to $SW_{20}$ cascaded from a weak (W) control signal output $W_{out}$ of power switch cell $SW_8$ to an $R_W$ input of the control circuit 710. Similar to the "dangling" tree structure of power gating circuit 600, the power gating circuit 700 further includes sets of power switch cells $SW_{91}$-$SW_{9K}$ to $SW_{201}$-$SW_{20K}$ coupled in parallel with power switch cells $SW_9$ to $SW_{20}$, respectively. Similar to the other power gating circuits, all of the power switch cells of power gating circuit 700 are coupled between a global power rail Vdd and a local power rail Vdd2. As the power switch cells $SW_{91}$-$SW_{9K}$ to $SW_{201}$-$SW_{20K}$ do not precede or drive a following power switch cell, they each may be implemented as a non-driving or end power switch cell, such as power switch cell 500.

In operation, in response to receiving a PWR_ON signal instructing the power gating circuit 700 to turn on a core coupled to local power rail Vdd2, the control circuit 710 generates (asserts) the weak (W) control signal. The weak (W) control signal propagates first through the first set of power switch cells $SW_1$ to $SW_8$ causing them to sequentially couple the global power rail Vdd to the local power rail Vdd2. Then the weak (W) control signal propagates through the second set of power switch cells $SW_9$ to $SW_{20}$, and to the sets of parallel power switch cells $SW_{91}$-$SW_{9K}$ to $SW_{201}$-$SW_{20K}$, sequentially causing them to couple the global power rail Vdd to the local power rail Vdd2 until the weak (W) control signal is received at the $R_W$ input of the control circuit 710.

Figure 7B:
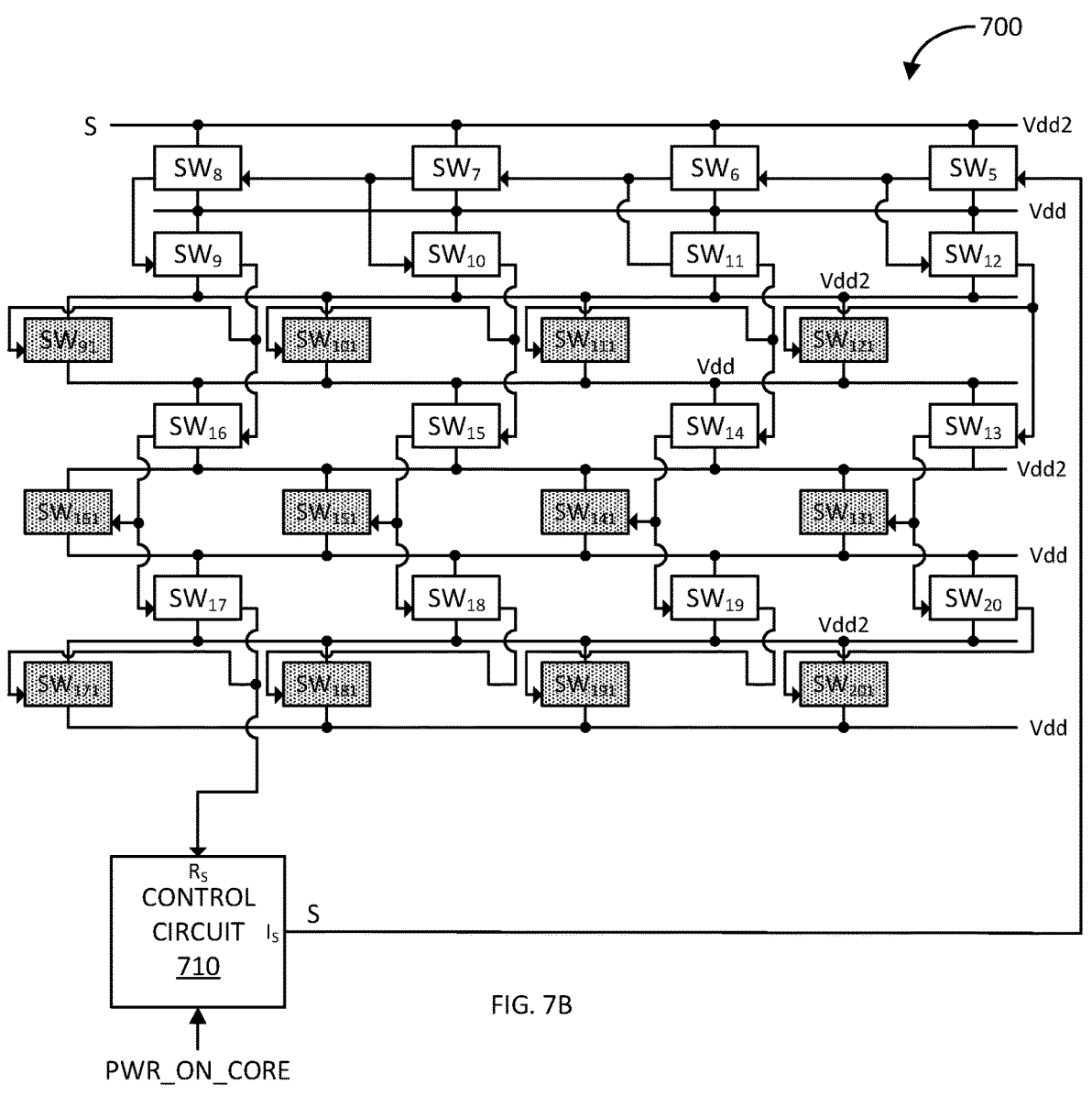

FIG. 7B illustrates a block diagram of the power gating circuit 700 with the strong (S) control signal routing or cell-to-cell interconnection in accordance with another aspect of the disclosure. The routing or cell-to-cell interconnection for the strong (S) control signal is based on a binary tree structure similar to the tree structure of power gating circuit 400 previously discussed.

More specifically, the control circuit 710 includes a strong (S) control signal output $I_S$ coupled to a strong (S) control signal input of power switch cell $SW_5$. The strong (S) control signal is routed via a portion of the first set of power switch cells, namely power switch cells $SW_5$ to $SW_9$. The strong (S) control signal is then routed from the strong (S) control signal output $S_{out}$ of power switch cell $SW_8$ to the strong (S) control signal input $R_S$ of the control circuit 710 via a second set of power switch cells $SW_9$, $SW_{16}$, and $SW_{17}$.

The strong (S) control signal is also routed from the strong (S) control signal output $S_{out}$ of the power switch cell $SW_5$ via a set of cascaded power switch cells $SW_{12}$, $SW_{13}$, $SW_{20}$, and $SW_{201}$. As indicated by its dark shading, the power switch cell $SW_{201}$ may be a non-driving or end power switch cell, similar to power switch cell 500 previously discussed. Additionally, the strong (S) control signal is routed from the strong (S) control signal output $S_{out}$ of power switch cell $SW_6$ via a set of cascaded power switch cells $SW_{11}$, $SW_{14}$, $SW_{19}$, and $SW_{191}$. As indicated by its dark shading, the power switch cell $SW_{191}$ may be a non-driving or end power switch cell, similar to power switch cell 500 previously discussed. Further, the strong (S) control signal is routed from the strong (S) control signal output $S_{out}$ of power switch cell $SW_7$ via a set of cascaded power switch cells $SW_{10}$, $SW_{15}$, $SW_{18}$, and $SW_{181}$. As indicated by its dark shading, the power switch cell $SW_{181}$ may be a non-driving or end power switch cell, similar to power switch cell 500 previously discussed.

The strong (S) control signal is also routed from the strong (S) control signal outputs Sour of power switch cells $SW_9$ to $SW_{13}$ to power switch cells $SW_{91}$, $SW_{101}$, $SW_{111}$, $SW_{121}$, $SW_{131}$, $SW_{141}$, $SW_{151}$, and $SW_{161}$, respectively. As indicated by its dark shading, the power switch cells $SW_{91}$, $SW_{101}$, $SW_{111}$, $SW_{121}$, $SW_{131}$, $SW_{141}$, $SW_{151}$, and $SW_{161}$ may be non-driving or end power switch cells, similar to power switch cell 500 previously discussed.

In operation, in response to receiving the weak (W) control signal at the $R_W$ input, the control circuit 710 generates (asserts) the strong (S) control signal. The strong (S) control signal propagates through the set of power switch cells $SW_5$ to $SW_9$, $SW_{16}$, and $SW_{17}$ to the $R_S$ input of the control circuit 710, causing the power switch cells to sequentially couple the global power rail Vdd to the local power rail Vdd2. The strong (S) control signal also propagates along the sets of power switch cells $SW_{12}$, $SW_{13}$, $SW_{20}$, and $SW_{201}$, $SW_{11}$, $SW_{14}$, $SW_{19}$, and $SW_{191}$, and $SW_{10}$, $SW_{15}$, $SW_{18}$, and $SW_{181}$ sequentially coupling the global power rail Vdd to the local power rail Vdd2, respectively. The strong (S) control signal also propagates to non-driving or end power switch cells $SW_{91}$, $SW_{101}$, $SW_{111}$, $SW_{121}$, $SW_{131}$, $SW_{141}$, $SW_{151}$, and $SW_{161}$ further coupling the global power rail Vdd to the local power rail Vdd2, respectively.

Figure 8:
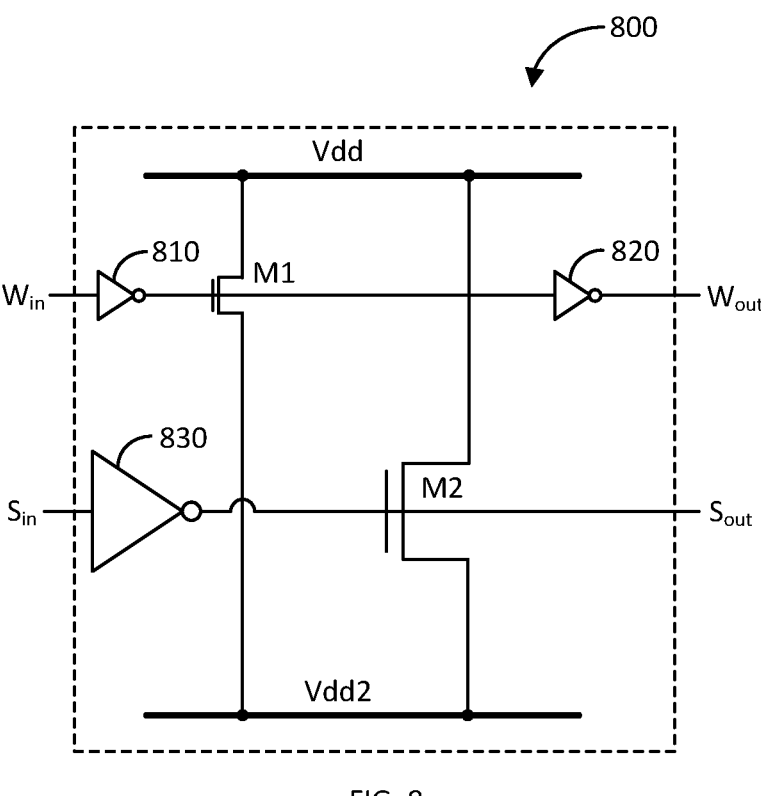
FIG. 8 illustrates a schematic diagram of another example power switch cell in accordance with another aspect of the disclosure.

FIG. 8 illustrates a schematic diagram of another example power switch cell 800 in accordance with another aspect of the disclosure. In the case of a power gating circuit where the weak (W) control signal has a cell-to-cell routing different than the strong (S) control signal (as in the case of power gating circuit 700), there may be one or more power switch cells that precedes or is driving a following power switch cell with respect to the weak (W) control signal, but not with respect to the strong (S) control signal. Such one or more power switch cells need not include an output buffer or inverter for the strong (S) control signal. The power switch cell 800 is an example detailed implementation of such one or more power switch cells.

In particular, with regard to the weak (W) control signal propagation path, the power switch cell 500 includes a first input buffer or inverter 810, a first FET M1 (which could be implemented as an NMOS FET or PMOS FET), and an output buffer or inverter 820. The first input buffer or inverter 810 includes an input serving as the weak (W) control signal input $W_{in}$ of the power switch cell 800. The first FET M1 is coupled between the global power rail Vdd and the local power rail Vdd2, and includes a gate coupled to an output of the first input buffer or inverter 810. The output buffer or inverter 820 includes an input coupled to the gate of the first FET M1, and an output serving as the weak (W) control signal output $W_{out}$ of the power switch cell 800.

With regard to the strong (S) control signal path, the power switch cell 800 includes a second input buffer or inverter 830 and a second FET M2 (which could be implemented as an NMOS FET or PMOS FET. The second input buffer or inverter 830 includes an input serving as the strong (S) control signal input $S_{in}$ of the power switch cell 800. The second FET M2 is coupled between the global power rail Vdd and the local power rail Vdd2, and includes a gate coupled to an output of the second input buffer or inverter 830. As discussed, the second FET M2 may be larger than the first FET M1. As the power switch cell 800 does not precede another power switch cell with regard to the strong (S) control signal, it need not include an output buffer or inverter in the strong (S) control signal path. Thus, the power switch cell 800 may be described as also having a floating strong (S) control signal output Sour.

Figure 9:
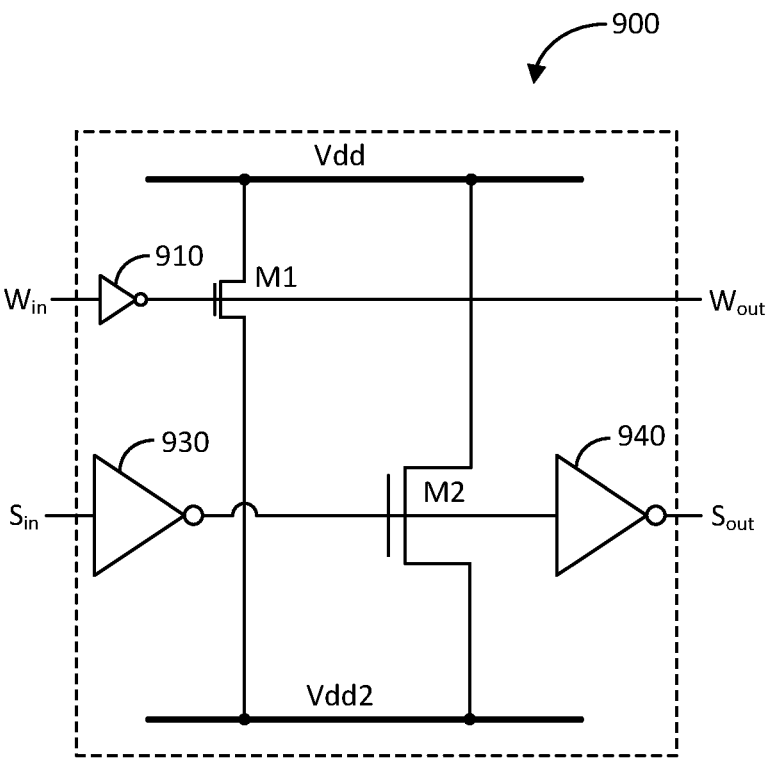
FIG. 9 illustrates a schematic diagram of another example power switch cell in accordance with another aspect of the disclosure.

FIG. 9 illustrates a schematic diagram of another example power switch cell 900 in accordance with another aspect of the disclosure. Similarly, in the case of a power gating circuit where the weak (W) control signal has a cell-to-cell routing different than the strong (S) control signal, there may be one or more power switch cells that precedes or is driving a following power switch cell with respect to the strong (S) control signal, but not with respect to the weak (W) control signal. Such one or more power switch cells need not include an output buffer or inverter for the weak (W) control signal. The power switch cell 900 is an example detailed implementation of such one or more power switch cells.

In particular, with regard to the weak (W) control signal path, the power switch cell 900 includes a first input buffer or inverter 910 and a first FET M1 (which could be implemented as an NMOS FET or PMOS FET). The first input buffer or inverter 910 includes an input serving as the weak (W) control signal input $W_{in}$ of the power switch cell 900. The first FET M1 is coupled between the global power rail Vdd and the local power rail Vdd2, and includes a gate coupled to an output of the first input buffer or inverter 910. As the power switch cell 900 does not precede another power switch cell with regard to the weak (W) control signal, it need not include an output buffer or inverter in the weak (W) control signal path. Thus, the power switch cell 500 may be described as having a floating weak (W) control signal output $W_{out}$.

With regard to the strong (S) control signal path, the power switch cell 900 includes a second input buffer or inverter 930, a second FET M2 (which could be implemented as an NMOS FET or PMOS FET, and an output buffer or inverter 940. The second input buffer or inverter 930 includes an input serving as the strong (S) control signal input $S_{in}$ of the power switch cell 900. The second FET M2 is coupled between the global power rail Vdd and the local power rail Vdd2, and includes a gate coupled to an output of the second input buffer or inverter 930. As discussed, the second FET M2 may be larger than the first FET M1. The output buffer or inverter 940 includes an input coupled to the gate of the second FET M2, and an output serving as the strong (S) control signal output Sour of the power switch cell 900.

FIG. 10 illustrates a flow diagram of an example method 1000 of supplying power to a circuit (core) in accordance with another aspect of the disclosure. The method 1000 includes propagating a first control signal via a first set of cascaded power switch cells to sequentially couple a first power rail to a second power rail, wherein the second power rail is coupled to a circuit (block 1010). Examples of means for propagating a first control signal via a first set of cascaded power switch cells to sequentially couple a first power rail to a second power rail include any of the first sets of power switch cells $SW_{11}$ to $SW_{84}$ of power gating circuit 400, $SW_1$ to $SW_{12}$ of power gating circuit 600, $SW_1$ to $SW_{20}$ of power gating circuit 700 for the weak (W) control signal, and $SW_5$ to $SW_9$, $SW_{16}$, and $SW_{17}$ of power gating circuit 700 for the strong (S) control signal.

The method 1000 further includes propagating the first control signal via a second set of at least one power switch cell coupled between a first pair of power switch cells of the first set to couple the first power rail to the second power rail (block 1020). Examples of means for propagating the first control signal via a second set of at least one power switch cell coupled between a first pair of power switch cells of the first set include any of the sets of power switch cells, such as $SW_{21}$ to $SW_{81}$, $SW_{22}$ to $SW_{82}$, and $SW_{23}$ to $SW_{83}$ of power gating circuit 400, $SW_{11}$-$SW_{1K}$ to $SW_{121}$-$SW_{12K}$ of power gating circuit 600, $SW_{91}$-$SW_{9K}$ to $SW_{201}$-$SW_{20K}$ for the weak (W) control signal of power gating circuit 700, and $SW_{12}$, $SW_{13}$, and $SW_{20}$, $SW_{11}$, $SW_{14}$, and $SW_{19}$, and $SW_{10}$, $SW_{15}$, and $SW_{18}$ for the strong (S) control signal of power gating circuit 700.

According to the method 1000, the propagating of the first control signal may include propagating the first control signal from a first output of a control circuit to a first input of the control circuit. Examples of means for propagating the first control signal from a first output of a control circuit to a first input of the control circuit include any of the sets of power switch cells that are cascaded from an output (e.g., $I_W$ and/or $I_S$) to an input (e.g., $R_W$ and/or $R_S$) any of the control circuits described herein. The method 1000 may further include propagating a second control signal from a second output to a second input of the control circuit via the first set of cascaded power switch cells to sequentially couple the first power rail to the second power rail. Examples of means for propagating a second control signal from a second output to a second input of the control circuit via the first set of cascaded power switch cells to sequentially couple the first power rail to the second power rail include any of the sets of power switch cells that are cascaded from outputs (e.g., $I_W$ and $I_S$) to input (e.g., $R_W$ and $R_S$) any of the control circuits described herein.

According to the method 1000, the propagating the first control signal via the second set of at least one power switch cell includes propagating the first control signal via the second set of cascaded power switch cells to sequentially couple the first power rail to the second power rail. Examples of means for propagating the first control signal via the second set of cascaded power switch cells to sequentially couple the first power rail to the second power rail include any of the sets of cascaded power switch cells coupled between a pair of power switch cells of the first set. Additionally, the method 1000 may include propagating the first control signal via the second set of parallel power switch cells to couple the first power rail to the second power rail. Examples of means for propagating the first control signal via the second set of parallel power switch cells to couple the first power rail to the second power rail include any of the parallel power switch cells of power gating circuits 600 and 700.

FIG. 11 illustrates a block diagram of an example wireless communication device 1100 in accordance with another aspect of the disclosure. The wireless communication device 1100 includes an integrated circuit (IC) 1110, which may be configured as a system on chip (SOC). The SOC 1110 includes a first core 1130, a power gating circuit 1120, and a second core 1140. The power gating circuit 1120 may be implemented per any of the power gating circuits 400, 600, and 700 previously described. Accordingly, the power gating circuit 1120 is coupled to a global power rail Vdd, a first local power rail Vdd1, and a second local power rail Vdd2.

The first and second local power rails Vdd1 and Vdd2 are coupled to the first and second cores 1130 and 1140, respectively. The power gating circuit 1120 is configured to receive a power on signal (PWR_ON) for selectively coupling the global power rail Vdd to one or both of the local power rails Vdd1 and Vdd2 to selectively enable the first and/or second cores 1130 and 1140, respectively. As an example, the first core 1130 may be implemented as a central processing unit (CPU) core, and the second core 1140 may be implemented as modem core. Accordingly, the second core 1140 may include one or more signal processing cores configured to process a baseband (BB) signal.

The wireless communication device 1100 further includes a transceiver 1150 and at least one antenna 1160 (e.g., an antenna array). Pursuant to a signal transmission operation, the one or more digital signal processing cores 1140 generate and provide a BB transmit signal to the transceiver 1150. The transceiver 1150 is configured to generate a radio frequency (RF) transmit signal based on the BB transmit signal (e.g., frequency up-conversion, RF filtering, pre-amplifying, phase shifting, power amplifying, etc.). The transceiver 1150 provides the RF transmit signal to the at least one antenna 1160 for wireless transmission to one or more remote wireless communication devices.

Pursuant to a signal reception operation, the at least one antenna 1160 receives an RF signal from one or more remote wireless communication devices. The transceiver 1150 is configured to generate a BB receive signal based on the RF receive signal (e.g., RF filtering, low noise amplifying (LNA), frequency down-converting, phase shifting, IF and/or BB amplifying, etc.). The one or more digital signal processing cores 1140 then process the BB receive signal to recover data therefrom.

The following provides an overview of aspect of the present disclosure:

Aspect 1: An apparatus, including: a first power rail; a second power rail; a control circuit including a first input and a first output; a first set of power switch cells coupled to the first and second power rails, wherein the first set of power switch cells are cascaded from the first output to the first input of the control circuit; and a second set of at least one power switch cell coupled to the first and second power rails, wherein the second set of at least one power switch cell is coupled to one of a first node between a first pair of power switch cells of the first set, the first output of the control circuit, and the first input of the control circuit.

Aspect 2: The apparatus of aspect 1, wherein the second set of at least one power switch cell includes a second set of cascaded power switch cells extending from one of the first node, the first output of the control circuit, and the first input of the control circuit.

Aspect 3: The apparatus of aspect 2, wherein a first subset of the first set of cascaded power switch cells extends in a direction substantially orthogonal to a direction towards which the second set of cascaded power switch cells extend.

Aspect 4: The apparatus of aspect 3, wherein a second subset of the first set of cascaded power switch cells extends in a direction substantially parallel with the direction towards which the second set of cascaded power switch cells extend.

Aspect 5: The apparatus of any one of aspects 1-4, further including a third set of at least one power switch cell coupled to the first and second power rails, wherein the third set of at least one power switch cell is coupled to a second node between a second pair of power switch cells of the first set.

Aspect 6: The apparatus of aspect 5, wherein the third set of at least one power switch cell includes a third set of cascaded power switch cells extending from the second node.

Aspect 7: The apparatus of any one of aspects 2-6, further including a third (or fourth) set of at least one power switch cell coupled to the first and second power rails, wherein the third (or fourth) set of at least one power switch cell is coupled to a second node between a second pair of power switch cells of the second set.

Aspect 8: The apparatus of aspect 7, wherein the third (or fourth) set of at least one power switch cell does not precede another power switch cell.

Aspect 9: The apparatus of aspect 8, wherein the third set of at least one power switch cell includes: a first buffer or inverter including a first input coupled to a first output of one of the second set of cascaded power switch cells; a first field effect transistor (FET) coupled between the first and second power rails, wherein the first FET includes a first gate coupled to a first output of the first buffer or inverter; a second buffer or inverter including a second input coupled to a second output of the one of the second set of cascaded power switch cells; and a second FET coupled between the first and second power rails, wherein the second FET includes a second gate coupled to a second output of the second buffer or inverter, and wherein the second FET is larger than the first FET.

Aspect 10: The apparatus of any one of aspects 2-9, wherein the second set of cascaded power switch cells includes a power switch cell that does not precede another power switch cell.

Aspect 11: The apparatus of any one of aspects 1-10, wherein each of the first set of cascaded power switch cells includes: a first buffer or inverter including a first input coupled to one of a first output of a preceding one of the first set of cascaded power switch cells and the first output of the control circuit; a first field effect transistor (FET) coupled between the first and second power rails, wherein the first FET includes a first gate coupled to a first output of the first buffer or inverter; a second buffer or inverter including a second input coupled to a second output of one of the preceding one of the first set of cascaded power switch cells and a second output of the control circuit; a second FET coupled between the first and second power rails, wherein the second FET includes a second gate coupled to a second output of the second buffer or inverter, and wherein the second FET is larger than the first FET; a third buffer or inverter including a third input coupled to the first gate of the first FET, and a third output coupled to one of a first input of a following one of the first set of cascaded power switch cells or the first input of the control circuit; and a fourth buffer or inverter including a fourth input coupled to the second gate of the second FET, and a fourth output coupled to one of a second input of the following one of the first set of cascaded power switch cells and a second input of the control circuit.

Aspect 12: The apparatus of any one of aspects 1-10, wherein at least one of the first set of cascaded power switch cells or at least one of the second set of at least one power switch cell, includes: a first buffer or inverter including a first input coupled to one of a first output of a preceding power switch cell and the first output of the control circuit; a first field effect transistor (FET) coupled between the first and second power rails, wherein the first FET includes a first gate coupled to a first output of the first buffer or inverter; a second buffer or inverter including a second input coupled to one of a second output of the or another preceding power switch cell and a second output of the control circuit; a second FET coupled between the first and second power rails, wherein the second FET includes a second gate coupled to a second output of the second buffer or inverter, and wherein the second FET is larger than the first FET; and a third buffer or inverter including a third input coupled to the first gate of the first FET, and a third output coupled to one of a first input of the following power switch cell and the first input of the control circuit, wherein the second gate is coupled to a floating output.

Aspect 13: The apparatus of any one of aspects 1-10, wherein at least one of the first set of cascaded power switch cells or at least one of the second set of at least one power switch cell, includes: a first buffer or inverter including a first input coupled to one of a first output of a preceding power switch cell and the first output of the control circuit; a first field effect transistor (FET) coupled between the first and second power rails, wherein the first FET includes a first gate coupled to a first output of the first buffer or inverter; a second buffer or inverter including a second input coupled to one of a second output of the or another preceding power switch cell and a second output of the control circuit; a second FET coupled between the first and second power rails, wherein the second FET includes a second gate coupled to a second output of the second buffer or inverter, and wherein the second FET is larger than the first FET; and a third buffer or inverter including a third input coupled to the second gate of the second FET, and a third output coupled to one of a first input of the following or another power switch cell and a second input of the control circuit, wherein the first gate is coupled to a floating output.

Aspect 14: The apparatus of any one of aspects 1-13, wherein the second set of at least one power switch cell includes a set of parallel power switch cells.

Aspect 15: The apparatus of aspect 14, wherein each of the set of parallel power switch cells does not precede another power switch cell.

Aspect 16: The apparatus of aspect 15, wherein each of the set of parallel power switch cells includes: a first buffer or inverter including a first input coupled to one of a first output of a preceding power switch cell of the first set and the first output of the control circuit; a second buffer or inverter including a second input coupled to one of a second output of the preceding power switch cell and a second output of the control circuit; and a second FET coupled between the first and second power rails, wherein the second FET includes a second gate coupled to a second output of the second buffer or inverter, and wherein the second FET is larger than the first FET.

Aspect 17: The apparatus of any one of aspects 1-16, wherein each of the first set of power switch cells includes: a first input coupled to one of the first output of the control circuit and a first output of the preceding power switch cell of the first set; a first output coupled to one of the first input of the control circuit and a first input of the following power switch cell of the first set; a second input coupled to one of a second output of the control circuit and a second output of the preceding power switch cell of the first set; and a second output coupled to one of a second input of the control circuit and a second input of the following power switch cell of the first set.

Aspect 18: The apparatus of any one of aspects 1-16, wherein at least one of the first set of power switch cells includes a first input coupled to one of the first output of the control circuit and a first output of the preceding power switch cell of the first set; a first output coupled to one of the first input of the control circuit and a first input of the following power switch cell of the first set; a second input coupled to one of a second output of the control circuit, a second output of the preceding power switch cell of the first set, and a third output of a first power switch cell not in the first set; and a second output coupled to one of a second input of the control circuit, a second input of the following power switch cell of the first set, and a third input of a second power switch cell not in the first set.

Aspect 19: The apparatus of any one of aspects 1-18, wherein at least one of the second set of power switch cells includes: a first input coupled to one of the first output of the control circuit, a first output of the preceding power switch cell of the first set, and a second output of the preceding power switch cell of the second set; and a second input coupled to one of a second output of the control circuit, a second output of the preceding power switch cell of the first set, and a third output of the preceding power switch cell of the second set.

Aspect 20: A method, including: propagating a first control signal via a first set of cascaded power switch cells to sequentially couple a first power rail to a second power rail, wherein the second power rail is coupled to a circuit; and propagating the first control signal via a second set of at least one power switch cell coupled between a first pair of power switch cells of the first set to couple the first power rail to the second power rail.

Aspect 21: The method of aspect 20, wherein propagating the first control signal includes propagating the first control signal from a first output of a control circuit to a first input of the control circuit.

Aspect 22: The method of aspect 21, further including propagating a second control signal from a second output to a second input of the control circuit via the first set of cascaded power switch cells to sequentially couple the first power rail to the second power rail.

Aspect 23: The method of any one of aspects 20-22, wherein the second set of at least one power switch cell includes a second set of cascaded power switch cells, and wherein propagating the first control signal via the second set of at least one power switch cell includes propagating the first control signal via the second set of cascaded power switch cells to sequentially couple the first power rail to the second power rail.

Aspect 24: The method of any one of aspects 20-23, wherein the second set of at least one power switch cell includes a set of parallel power switch cells, and wherein propagating the first control signal via the second set of at least one power switch cell includes propagating the first control signal via the set of parallel power switch cells to couple the first power rail to the second power rail.

Aspect 25: An apparatus, including: means for propagating a first control signal via a first set of cascaded power switch cells to sequentially couple a first power rail to a second power rail, wherein the second power rail is coupled to a circuit; and means for propagating the first control signal via a second set of at least one power switch cell coupled between a first pair of power switch cells of the first set to couple the first power rail to the second power rail.

Aspect 26: The apparatus of aspect 25, wherein the means for propagating the first control signal includes means for propagating the first control signal from a first output of a control circuit to a first input of the control circuit.

Aspect 27: The apparatus of aspect 25 or 26, wherein the second set of at least one power switch cell includes a second set of cascaded power switch cells, and wherein the means for propagating the first control signal via the second set of at least one power switch cell includes means for propagating the first control signal via the second set of cascaded power switch cells to sequentially couple the first power rail to the second power rail.

Aspect 28: The apparatus of any one of aspects 25-27, wherein the second set of at least one power switch cell includes a set of parallel power switch cells, and wherein the means for propagating the first control signal via the second set of at least one power switch cell includes means for propagating the first control signal via the second set of parallel power switch cells to couple the first power rail to the second power rail.

Aspect 29: A wireless communication device, including: at least one antenna; a transceiver coupled to the at least one antenna; a signal processing core coupled to the transceiver; a first power rail; a second power rail coupled to the signal processing core; a control circuit including a first input and a first output; a first set of cascaded power switch cells coupled to the first and second power rails, wherein the first set of power switch cells are cascaded from the first output to the first input of the control circuit; and a second set of at least one power switch cell coupled to the first and second power rails, wherein the second set of at least one power switch cell is coupled to one of a first node between a first pair of power switch cells of the first set, the first output of the control circuit, and the first input of the control circuit.

Aspect 30: The wireless communication device of aspect 29, wherein the second set of at least one power switch cell includes a second set of cascaded power switch cells extending from one of the first node, the first output of the control circuit, and the first input of the control circuit.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a first power rail;
   a second power rail;
   a control circuit including a first input, a first output, a second input, and a second output;
   a first set of power switch cells coupled to the first and second power rails, wherein the first set of power switch cells are cascaded from the first output to the first input of the control circuit in accordance with a first cell-to-cell routing, and wherein at least a portion of the first set of power switch cells are cascaded from the second output to the second input of the control circuit in accordance with a second cell-to-cell routing, the second cell-to-cell routing being different than the first cell-to-cell routing; and
   a second set of at least one power switch cell coupled to the first and second power rails, wherein the second set of at least one power switch cell is coupled to one of a first node between a first pair of power switch cells of the first set, the first output of the control circuit, and the first input of the control circuit.

2. The apparatus of claim 1, wherein the second set of at least one power switch cell comprises a second set of cascaded power switch cells extending from one of: the first node, the first output of the control circuit, and the first input of the control circuit.

3. The apparatus of claim 2, further comprising a third set of at least one power switch cell coupled to the first and second power rails, wherein the third set of at least one power switch cell is coupled to a second node between a second pair of power switch cells of the second set.

4. The apparatus of claim 3, wherein the third set of at least one power switch cell does not precede another power switch cell.

5. The apparatus of claim 4, wherein the third set of at least one power switch cell comprises:
   a first buffer or inverter including a first input coupled to a first output of one of the second set of cascaded power switch cells;
   a first field effect transistor (FET) coupled between the first and second power rails, wherein the first FET includes a first gate coupled to a first output of the first buffer or inverter;
   a second buffer or inverter including a second input coupled to a second output of the one of the second set of cascaded power switch cells; and
   a second FET coupled between the first and second power rails, wherein the second FET includes a second gate coupled to a second output of the second buffer or inverter, and wherein the second FET is larger than the first FET.

6. The apparatus of claim 1, wherein each of the first set of cascaded power switch cells comprises:

a first buffer or inverter including a first input coupled to one of a first output of a preceding one of the first set of cascaded power switch cells and the first output of the control circuit;

a first field effect transistor (FET) coupled between the first and second power rails, wherein the first FET includes a first gate coupled to a first output of the first buffer or inverter;

a second buffer or inverter including a second input coupled to a second output of one of the preceding one of the first set of cascaded power switch cells and the second output of the control circuit;

a second FET coupled between the first and second power rails, wherein the second FET includes a second gate coupled to a second output of the second buffer or inverter, and wherein the second FET is larger than the first FET;

a third buffer or inverter including a third input coupled to the first gate of the first FET, and a third output coupled to one of a first input of a following one of the first set of cascaded power switch cells or the first input of the control circuit; and a fourth buffer or inverter including a fourth input coupled to the second gate of the second FET, and a fourth output coupled to one of a second input of the following one of the first set of cascaded power switch cells and the second input of the control circuit.

7. The apparatus of claim 1, wherein at least one of the first set of cascaded power switch cells or at least one of the second set of at least one power switch cell, comprises:

a first buffer or inverter including a first input coupled to one of a first output of a preceding power switch cell and the first output of the control circuit;

a first field effect transistor (FET) coupled between the first and second power rails, wherein the first FET includes a first gate coupled to a first output of the first buffer or inverter;

a second buffer or inverter including a second input coupled to one of a second output of the or another preceding power switch cell and the second output of the control circuit;

a second FET coupled between the first and second power rails, wherein the second FET includes a second gate coupled to a second output of the second buffer or inverter, and wherein the second FET is larger than the first FET; and a third buffer or inverter including a third input coupled to the first gate of the first FET, and a third output coupled to one of a first input of the following power switch cell and the first input of the control circuit, wherein the second gate is coupled to a floating output.

8. The apparatus of claim 1, wherein at least one of the first set of cascaded power switch cells or at least one of the second set of at least one power switch cell, comprises:

a first buffer or inverter including a first input coupled to one of a first output of a preceding power switch cell and the first output of the control circuit;

a first field effect transistor (FET) coupled between the first and second power rails, wherein the first FET includes a first gate coupled to a first output of the first buffer or inverter;

a second buffer or inverter including a second input coupled to one of a second output of the or another preceding power switch cell and the second output of the control circuit;

a second FET coupled between the first and second power rails, wherein the second FET includes a second gate coupled to a second output of the second buffer or inverter, and wherein the second FET is larger than the first FET; and a third buffer or inverter including a third input coupled to the second gate of the second FET, and a third output coupled to one of a first input of the following or another power switch cell and the second input of the control circuit, wherein the first gate is coupled to a floating output.

9. The apparatus of claim 1, wherein the second set of at least one power switch cell comprises a set of parallel power switch cells.

10. The apparatus of claim 9, wherein each of the set of parallel power switch cells does not precede another power switch cell.

11. The apparatus of claim 10, wherein each of the set of parallel power switch cells comprises:

a first buffer or inverter including a first input coupled to one of a first output of a preceding power switch cell of the first set and the first output of the control circuit;

a first field effect transistor (FET) coupled between the first and second power rails, wherein the first FET includes a first gate coupled to a first output of the first buffer or inverter;

a second buffer or inverter including a second input coupled to one of a second output of the preceding power switch cell and the second output of the control circuit; and a second FET coupled between the first and second power rails, wherein the second FET includes a second gate coupled to a second output of the second buffer or inverter, and wherein the second FET is larger than the first FET.

12. The apparatus of claim 1, wherein each of the first set of power switch cells comprises:

a first input coupled to one of the first output of the control circuit and a first output of the preceding power switch cell of the first set;

a first output coupled to one of the first input of the control circuit and a first input of the following power switch cell of the first set;

a second input coupled to one of the second output of the control circuit and a second output of the preceding power switch cell of the first set; and a second output coupled to one of the second input of the control circuit and a second input of the following power switch cell of the first set.

13. The apparatus of claim 1, wherein at least one of the first set of power switch cells comprises:

a first input coupled to one of the first output of the control circuit and a first output of the preceding power switch cell of the first set;

a first output coupled to one of the first input of the control circuit and a first input of the following power switch cell of the first set;

a second input coupled to one of the second output of the control circuit, a second output of the preceding power switch cell of the first set, and a third output of a first power switch cell not in the first set; and a second output coupled to one of the second input of the control circuit, a second input of the following power switch cell of the first set, and a third input of a second power switch cell not in the first set.

14. The apparatus of claim 1, wherein at least one of the second set of power switch cells comprises:

a first input coupled to one of the first output of the control circuit, a first output of the preceding power switch cell of the first set, and a second output of the preceding power switch cell of the second set; and a second input coupled to one of the second output of the control circuit, a second output of the preceding power switch cell of the first set, and a third output of the preceding power switch cell of the second set.

15. The apparatus of claim 1, wherein the second set of at least one power switch cell comprises a second set of power switch cells cascaded from the first input of the control circuit in accordance with a third cell-to-cell routing, and wherein the second set of power switch cells are cascaded from the second input of the control circuit in accordance with a fourth cell-to-cell routing being different than the third cell-to-cell routing.

16. A method, comprising:

propagating a first control signal via a first set of cascaded power switch cells from a first output to a first input of a control circuit in accordance with a first cell-to-cell routing to sequentially couple a first power rail to a second power rail, wherein the second power rail is coupled to a circuit;

propagating a second control signal via at least a portion of the first set of cascaded power switch cells from a second output to a second input of the control circuit in accordance with a second cell-to-cell routing to sequentially couple the first power rail to the second power rail, wherein the second cell-to-cell routing is different than the first cell-to-cell routing; and propagating the first control signal via a second set of at least one power switch cell coupled between a first pair of power switch cells of the first set to couple the first power rail to the second power rail;

wherein the second set of at least one power switch cell comprises a set of parallel power switch cells, and wherein propagating the first control signal via the second set of at least one power switch cell comprises propagating the first control signal via the set of parallel power switch cells to couple the first power rail to the second power rail.

17. The method of claim 16, wherein propagating the first control signal via a second set of at least one power switch cell comprises propagating the first control signal via a second set of cascaded power switch cells in accordance with a third cell-to-cell routing, and further comprising propagating the second control signal via the second set of cascaded power switch cells in accordance with a fourth cell-to-cell routing, the fourth cell-to-cell routing being different than the third cell-to-cell routing.

18. An apparatus, comprising:

means for propagating a first control signal via a first set of cascaded power switch cells from a first output to a first input of a control circuit in accordance with a first cell-to-cell routing to sequentially couple a first power rail to a second power rail, wherein the second power rail is coupled to a circuit;

means for propagating a second control signal via at least a portion of the first set of cascaded power switch cells from a second output to a second input of the control circuit in accordance with a second cell-to-cell routing to sequentially couple the first power rail to the second power rail, wherein the second cell-to-cell routing is different than the first cell-to-cell routing; and means for propagating the first control signal via a second set of at least one power switch cell coupled between a first pair of power switch cells of the first set to couple the first power rail to the second power rail;

wherein the second set of at least one power switch cell comprises a set of parallel power switch cells, and wherein the means for propagating the first control signal via the second set of at least one power switch cell comprises means for propagating the first control signal via the second set of parallel power switch cells to couple the first power rail to the second power rail.

19. A wireless communication device, comprising:

at least one antenna;

a transceiver coupled to the at least one antenna;

a signal processing core coupled to the transceiver;

a first power rail;

a second power rail coupled to the signal processing core;

a control circuit including a first input, a first output, a second input, and a second output;

a first set of cascaded power switch cells coupled to the first and second power rails, wherein the first set of power switch cells are cascaded from the first output to the first input of the control circuit in accordance with a first cell-to-cell routing, and wherein at least a portion of the first set of power switch cells are cascaded from the second output to the second input of the control circuit in accordance with a second cell-to-cell routing, the second cell-to-cell routing being different than the first cell-to-cell routing; and a second set of at least one power switch cell coupled to the first and second power rails, wherein the second set of at least one power switch cell is coupled to one of a first node between a first pair of power switch cells of the first set, the first output of the control circuit, and the first input of the control circuit.

20. The wireless communication device of claim 19, wherein the second set of at least one power switch cell comprises a second set of cascaded power switch cells extending from one of the first node, the first output of the control circuit, and the first input of the control circuit.

* * * * *